(12) United States Patent
Hong et al.

(10) Patent No.: US 10,950,166 B2
(45) Date of Patent: Mar. 16, 2021

(54) DISPLAY DEVICE INCLUDING MAIN PORTIONS AND CURVED BRIDGE PORTIONS

(71) Applicant: SAMSUNG DISPLAY CO., LTD., Yongin-si (KR)

(72) Inventors: Jong Ho Hong, Yongin-si (KR); Sang Woo Kim, Seoul (KR); Jae Min Shin, Suwon-si (KR); Hye Jin Joo, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/444,466

(22) Filed: Jun. 18, 2019

(65) Prior Publication Data

US 2020/0020273 A1 Jan. 16, 2020

(30) Foreign Application Priority Data

Jul. 13, 2018 (KR) .................. 10-2018-0081627

(51) Int. Cl.
*G09G 3/32* (2016.01)
*G09G 3/20* (2006.01)

(52) U.S. Cl.
CPC ............ *G09G 3/32* (2013.01); *G09G 3/2003* (2013.01); *G09G 2300/0426* (2013.01); *G09G 2300/0452* (2013.01)

(58) Field of Classification Search
CPC ............. G09G 3/32; G09G 3/2003; G09G 2300/0452; G09G 2300/0426; H01L 27/3276; H01L 51/0097
See application file for complete search history.

(56) References Cited

U.S. PATENT DOCUMENTS

| 8,207,473 | B2 | 6/2012 | Axisa et al. |
| 8,552,299 | B2 | 10/2013 | Rogers et al. |
| 8,883,287 | B2 | 11/2014 | Boyce et al. |
| 9,799,108 | B2 | 10/2017 | Hong et al. |
| 2006/0170634 | A1* | 8/2006 | Kwak ............... H01L 27/3272 345/92 |
| 2016/0111481 | A1 | 4/2016 | Jeong et al. |
| 2016/0268352 | A1* | 9/2016 | Hong ................ H01L 27/326 |
| 2017/0181277 | A1* | 6/2017 | Tomita .............. H05K 1/0283 |

(Continued)

FOREIGN PATENT DOCUMENTS

| CN | 107994052 | 5/2018 |
| KR | 10-2016-0110689 | 9/2016 |
| KR | 10-2018-0045968 | 5/2018 |

OTHER PUBLICATIONS

European Search Report issued in corresponding European Patent Application No. 19185871.1 dated Nov. 29, 2019.

*Primary Examiner* — Ryan A Lubit
(74) *Attorney, Agent, or Firm* — F. Chau & Associates, LLC

(57) ABSTRACT

A display device including: a plurality of main portions separated. from each other; and a plurality of bridges connecting adjacent main portions to each other, wherein a first main portion of the plurality of main portions includes a transistor and a light emitting element, a first bridge of the plurality of bridges includes a wiring that is electrically connected to the transistor or the light emitting element, and the first bridge includes curved parts that are curved in at least two different directions from each other.

19 Claims, 28 Drawing Sheets

(56) References Cited

U.S. PATENT DOCUMENTS

2018/0046221 A1 2/2018 Choi et al.
2018/0114825 A1 4/2018 Hong et al.
2019/0267430 A1* 8/2019 Choi .................. H01L 51/0097

* cited by examiner

DISPLAY DEVICE INCLUDING MAIN PORTIONS AND CURVED BRIDGE PORTIONS

CROSS-REFERENCE TO RELATED APPLICATION

This application claims priority under 35 U.S.C. § 119 to Korean Patent Application No. 10-2018-0081627 filed in the Korean intellectual Property Office on Jul. 13, 2018, the disclosure of which is incorporated by reference herein in its entirety.

(a) Technical Field

The present invention relates to a display device.

(b) Description of the Related Art

A display device may include a plurality of pixels for displaying an image, A light emitting diode (LED) display is an example of one such display device. The LED-type display devices may include an organic LED display in which an organic emission layer is included in an LED, a micro LED display device using an LED chip with a size of several micrometers as a light emission material, a quantum dot LED display device using a quantum dot, etc.

Recently, a deformable display device that can be bent, folded, elongated, or reduced in size has been developed.

SUMMARY

A display device according to an exemplary embodiment of the present invention comprises: a plurality of main portions separated from each other; and a plurality of bridges connecting adjacent main portions to each other, wherein a first main portion of the plurality of main portions comprises a transistor and a light emitting element, a first bridge of the plurality of bridges comprises a wiring that is electrically connected to the transistor or the light emitting element, and the first bridge comprises curved parts that are curved in at least two different directions from each other.

The first bridge may comprise a first curved part and a pair of second curved parts connected to respective ends of the first curved part, and a curve direction of the first curved part and a curve direction of the pair of second curved parts may be different from each other.

A curvature radius of each inner edge of the pair of second curved parts may be the same.

The curvature radius of the inner edge of the second curved part may be larger than a curvature radius of an inner edge of the first curved part.

The curvature radius of the inner edge of the second curved part may be less than 90 micrometers.

The wiring may include at least one of a data line, a driving voltage line for transmitting a first voltage, a voltage transmitting line for transmitting a second voltage different from the first voltage, and a gate line.

The first bridge may comprise a substrate, a first insulating layer disposed on the substrate, and a second insulating layer disposed on the first insulating layer, the wiring may be disposed between the first insulating layer and the second insulating layer, and the first insulating layer and the second insulating layer may comprise an organic insulating material.

The first insulating layer may not overlap the transistor of the first main portion.

The first main portion may comprise at least one insulating layer disposed on the substrate, the at least one insulating layer may not exist in the first bridge, and the first insulating layer of the first bridge may be in contact with a side surface of the at least one insulating layer near a boundary between the first bridge and the first main portion.

The first main portion may comprise: the substrate; an active pattern disposed on the substrate; a third insulating layer disposed on the active pattern; a first conductive layer disposed on the third insulating layer; a fourth insulating layer disposed on the first conductive layer; a second conductive layer disposed on the fourth insulating layer; the second insulating layer disposed on the second conductive layer; a first electrode disposed on the second insulating layer; an emission layer disposed on the first electrode; and a second electrode disposed on the emission layer, and the wiring may comprise a first portion in contact with the first insulating layer in the first bridge, and a second portion in contact with the fourth insulating layer in the first main portion.

The second insulating layer may comprise a groove enclosing the transistor and the light emitting element near an edge of the first main portion.

The first bridge may comprise a first portion connected to the first main portion and a second portion connected to the first portion, the first portion may be curved in a clockwise direction or a counterclockwise direction, and the second portion may be curved in a different direction from that of the first portion.

A second main portion of the plurality of main portions may be adjacent to the first main portion, the first bridge connecting the first main portion and the second main portion to each other may comprise a first portion directly connected to the first main portion, and a second portion directly connected to the second main portion, the first portion may be curved in a clockwise direction or a counterclockwise direction, and the second portion may be curved in a different direction from that of the first portion.

The plurality of bridges may comprise the first bridge, a second bridge, a third bridge, and a fourth bridge, wherein each of the first, second, third and fourth bridges is connected to the first main portion, and adjacent bridges among the first, second, third and fourth bridges may have symmetrical shapes rotated by 90 degrees.

The first main portion may have a shape of a polygon, a circle, or an oval.

A display device according to an exemplary embodiment of the present invention may comprise: a main portion comprising a transistor and a light emitting element; and a plurality of connection parts connected to the main portion, at least one of the plurality of connection parts may comprise: a first portion connected to the main portion and having an inner edge curved in a first curvature radius; and a second portion connected to the first portion, having an inner edge curved in a second curvature radius that is different from the first curvature radius, and curved in a different direction from that of the first portion.

The first curvature radius may be larger than the second curvature radius.

The main portion and the plurality of connection parts may comprise a substrate, the plurality of connection parts may comprise wiring electrically connected to the transistor or the light emitting element, a first insulating layer comprising an organic insulating material may be disposed between the wiring and the substrate, and the main portion may comprise an area without the first insulating layer.

The main portion may comprise at least one insulating layer disposed between the substrate and the light emitting element, and the plurality of connection parts may not comprise the at least one insulating layer.

The first portion may be curved in a direction toward the main portion, and the second portion may be curved in the direction away from the main portion.

A curvature radius of a corner where the first portion is connected to the main portion may be smaller than the first curvature radius.

A display device according to an exemplary embodiment of the present invention may comprise: first and second main portions disposed adjacent to each other in a first row; and third and fourth main portions disposed adjacent to each other in a second row, wherein the first and third main portions are disposed in a first column, and the second and fourth main portions are disposed in a second column, wherein the first and second main portions are connected to each other via a first flexible bridge, the second and fourth main portions are connected to each other via a second flexible bridge, the fourth and third main portions are connected to each other via a third flexible bridge, and the third and first main portions are connected to each other via a fourth flexible bridge, wherein each of the first, second, third and fourth flexible bridges includes two curved connection parts.

The two curved connection parts of each of the first, second, third and fourth flexible bridges may form a U-shape where they meet.

The first main portion may have a square shape with a first curved connection part protruded from a first edge, a second curved connection part protruded from a second edge, a third curved connection part protruded from a third edge, and a fourth curved connection part protruded from a fourth edge.

DETAILED DESCRIPTION OF THE EMBODIMENTS

Figure 1:
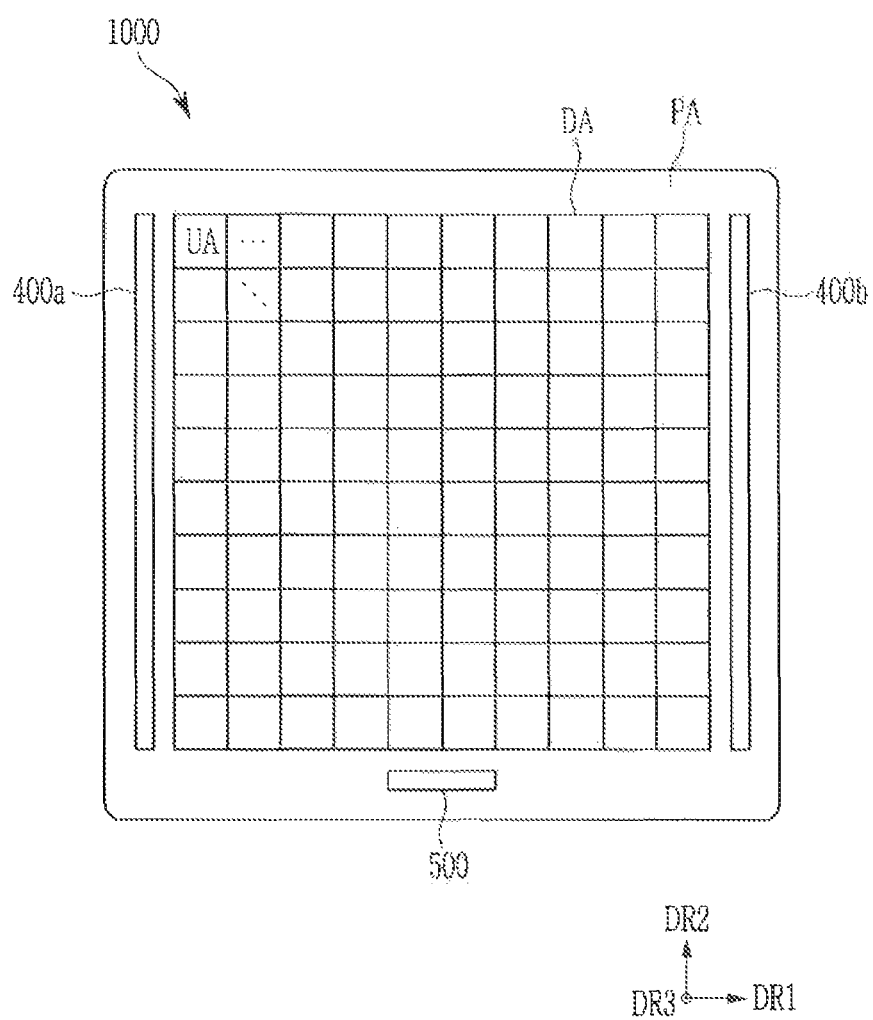
FIG. 1 is a layout view of a display device according to an exemplary embodiment of the present invention.

Hereinafter, exemplary embodiments of the present invention will be described in detail with reference to the accompanying drawings. As those skilled in the art would realize, the described embodiments may be modified in various different ways, and thus, should not be limited to the embodiments set forth herein.

Like reference numerals may designate like elements throughout the specification.

In the drawings, the thickness of layers, films, panels, areas, etc., may be exaggerated for clarity.

It will be understood that when an element such as a layer, film, area, or substrate is referred to as being "on" another element, it can be directly on the other element or intervening elements may also be present.

Throughout this specification and the claims which follow, a plan view may be a view of a surface parallel to two directions (e.g., a direction DR1 and a direction DR2) crossing each other, and a cross-sectional view may be a view of a surface cut in a direction (e.g., a direction DR3) perpendicular to the surface parallel to the direction DR1 and the direction DR2. In addition, to overlap two constituent elements may mean that two constituent elements are overlapped in the direction DR3 (e.g., a direction perpendicular to an upper surface of a substrate).

A display device according to an exemplary embodiment of the present invention will now be described with reference to FIG. 1 to FIG. 4.

Referring to FIG. 1, a display device 1000 according to an exemplary embodiment of the present invention includes a display area DA and a peripheral area PA around the display area DA in a plan view. The display area DA may be referred to as an active area and may display an image on a surface parallel to the first direction DR1 and the second direction DR2.

A plurality of unit areas UA and a plurality of signal lines are disposed in the display area DA. The unit areas UA may be arranged in a regular arrangement shape, for example, in a matrix.

Figure 2:
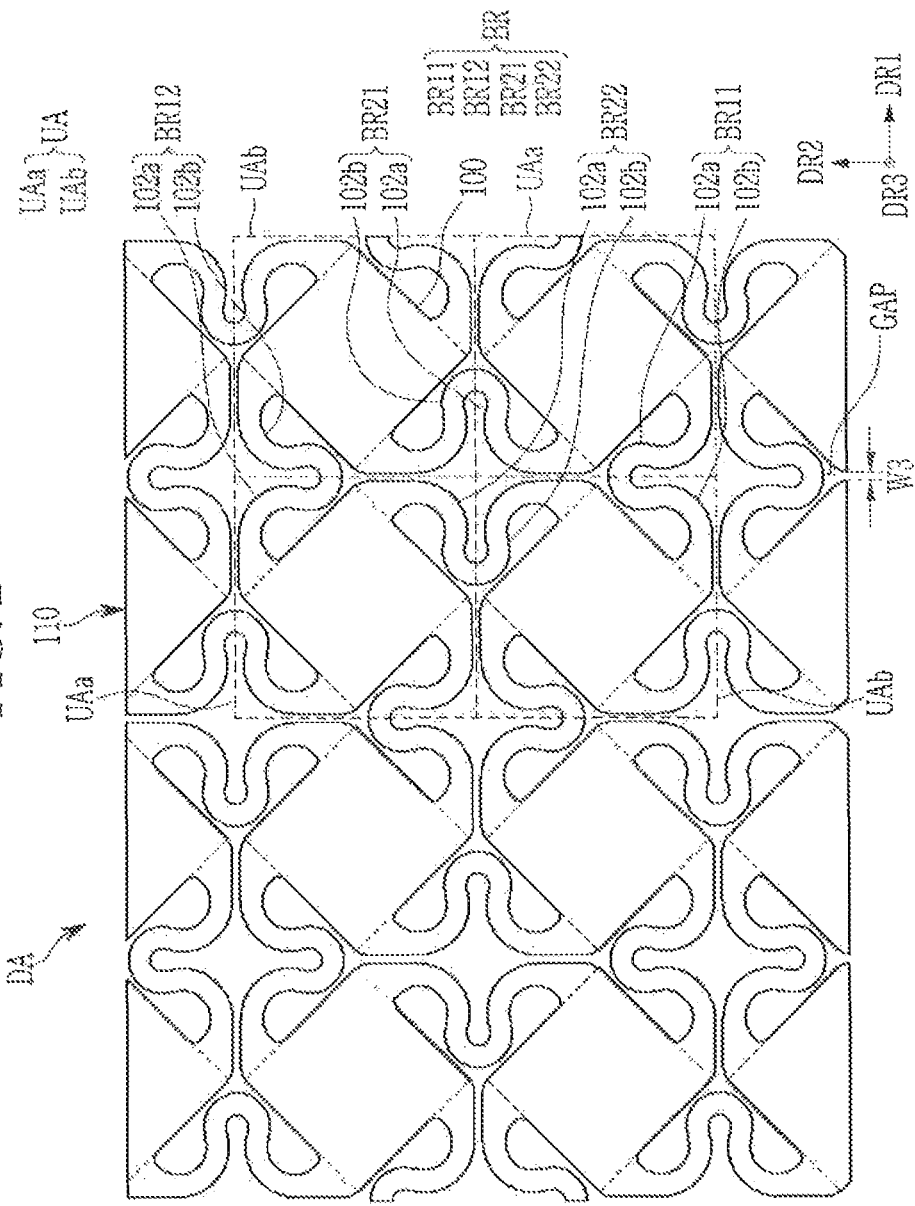
FIG. 2 is a plan layout view of a display area of a display device according to an exemplary embodiment of the present invention.

Referring to FIG. 2, a plurality of unit areas UA may include a unit area UAa and a unit area UAb adjacent to each other in the first direction DR1 and the second direction DR2. The unit area UAa and the unit area UAb are alternately arranged. Each of unit areas UAa and UAb includes one main portion 100, the unit area UAa includes a plurality of connection parts 102a connected to the main portion 100, and the unit area UAb includes a plurality of connection parts 102b connected to the main portion 100.

in the display area DA, the plurality of main portions 100 may be arranged in the regular arrangement shape, for example, the matrix, and may be separated from each other. A plan shape of the main portion 100 of each of the unit areas UAa and UAb may be one of various polygons, circles, or ovals. In the present exemplary embodiment, the plan shape of the main portion 100 is the polygon, an approximate square among them is described as an example, but the present invention is not limited thereto.

Figure 3:
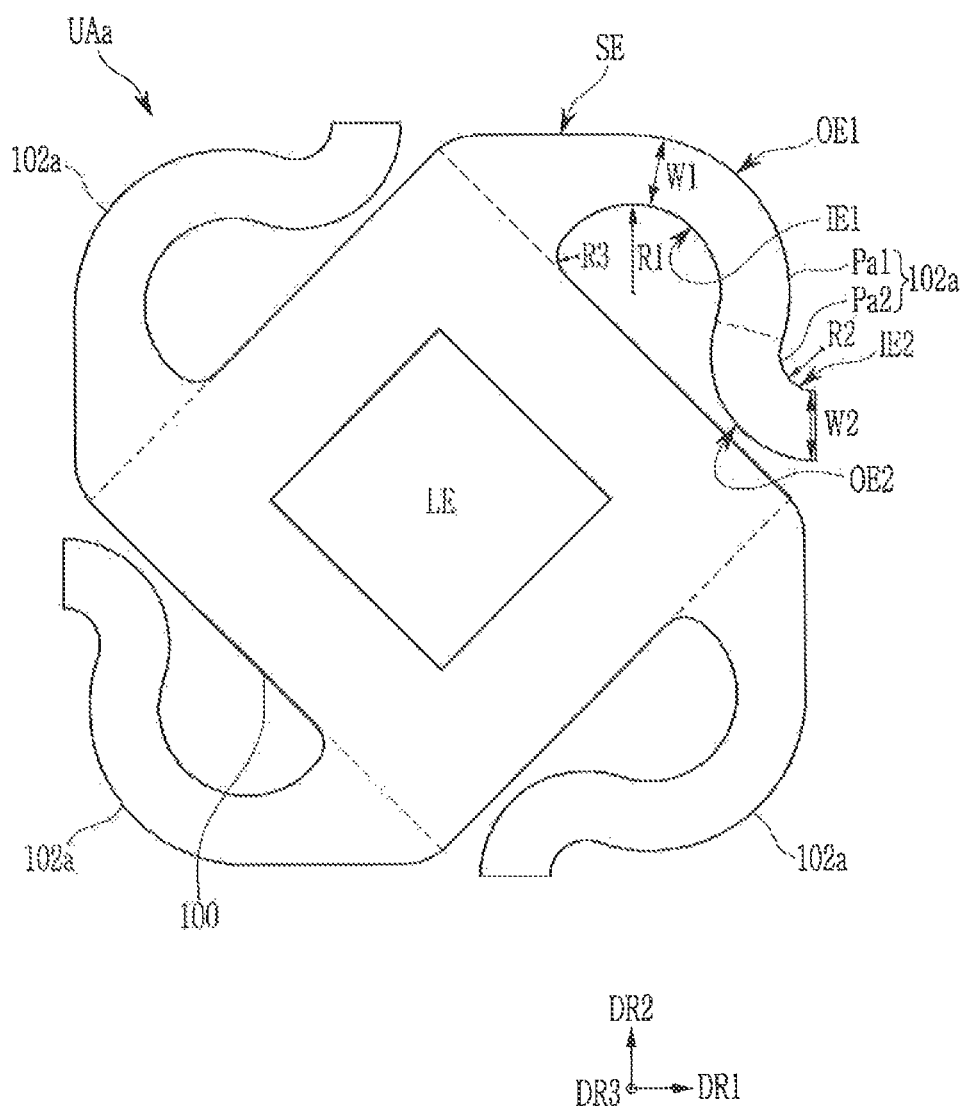
FIG. 3 is a top plan view of an a unit area disposed in a display area of a display device according to an exemplary embodiment of the present invention.

Referring to FIG. 3, at least one light emitting element LE and an electrical element electrically connected to the light emitting element LE may be positioned in each main portion 100. The light emitting element LE may include various light emitting elements such as an organic light emitting diode (LED) including an organic emission layer, a micro LED, a quantum dot LED, etc. The electrical element may include at least one transistor, capacitor, etc. connected to the light emitting element LE.

In the unit area UAa, the connection part 102a may have a belt shape curved in at least two different directions. For example, the connection part 102a may include a first portion Pa1 curved in a clockwise direction while being apart from the main portion 100, and a second portion Pa2 curved in a counterclockwise direction and connected to the first portion Pa1. In other words, the first portion Pa1 may be curved toward the main portion 100 and the second portion Pa2 may be curved away from the main portion 100.

At least part of an inner edge IE1 and an outer edge OE1 of the first portion Pa1 and an inner edge IE2 and an outer edge OE2 of the second portion Pa2 may form a curved line. A curvature radius R1 of the inner edge IE1 of the first portion Pa1 and a curvature radius R2 of the inner edge IE2 of the second portion Pa2 may be different from each other. For example, the curvature radius R1 may be larger than the curvature radius R2. Here, the curvature radius may be an average of the curvature radius of the entire corresponding portion.

A curvature radius R3 of an inner corner where the inner edge IE1 of the first portion Pa1 and the edge of the main portion 100 meet may he different from the curvature radius R1 of the inner edge IE1 of the first portion Pa1. For example, the curvature radius R3 may be smaller than the curvature radius R1. Alternatively, an inner corner where the inner edge IE1 of the first portion Pa1 and the edge of the main portion 100 meet may be a sharp corner instead of the curved line. In this case, for example, the curvature radius R3 may be 0.

The outer edge OE1 of the first portion Pa1 may be substantially parallel to the inner edge IE1 of the first portion. Pa1, However, a part of the outer edge OE1 may not be parallel to the inner edge IE1. For example, of the outer edge OE1, the portion adjacent to the main portion 100 may form a straight edge SE that is almost linear and not parallel to the inner edge; whereas, the remaining portion of the outer edge OE1 may be substantially parallel to the inner edge IE1. Accordingly, a width W1 of the first portion Pa1 may not be uniform in some areas, but may be substantially uniform in other areas. FIG. 3 shows an example in which the width W1 of the first portion Pa1 is not uniform. The width W1 of the first portion Pa1 decreases away from the main portion 100, and may maintain an almost constant width from a predetermined position.

The outer edge OE2 of the second portion Pa2 may be substantially parallel to the inner edge IE2 of the second portion Pa2. Accordingly, the width W2 of the second portion Pa2 may be substantially constant. Alternatively, the width W2 of the second portion Pa2 may not be constant.

The minimum width of the connection part 102a may be smaller than a length of any one edge of the main portion 100.

In the unit area UAa, four connection parts 102a may be connected to the main portion 100, and each of the connection parts 102a may be respectively connected to edges of the main portion 100 facing different directions. For example, the outer edge OE1 of the first portion Pa1 of each connection part 102a may meet the corner (or vertex) of the main portion 100. The shape of the four connection parts 102a connected to one main portion 100 and the connection relationship with the main portion 100 are the same as each other, such that when the unit area UAa is rotated by 90 degrees, 180 degrees, 270 degrees, or 360 degrees the unit area UAa may have the same shape as it did before being rotated. In other words, the four connection parts 102a connected to one main portion 100 may have shapes that are symmetrically rotated by 90 degrees with respect to each other.

In one unit area UAa, the outer end portions of the connection parts 102a may face different directions from each other. In other words, the end portion of the connection part 102a connected to the left-upper edge of the main portion 100 may face toward the upper side of the second direction DR2, the end portion of the connection part 102a connected to the right-upper edge of the main portion 100 may face toward the right of the first direction DR1, the end portion of the connection part 102a connected to the right-lower edge of the main portion 100 may face toward the lower side of the second direction DR2, and the end portion of the connection part 102a connected to the left-lower edge of the main portion 100 may face toward the left of the first direction DR1.

The shape of the unit area UAb adjacent to the unit area UAa, in other words, the shape of the main portion 100 and the connection parts 102b of the unit area UAb, may have mirror symmetry to the main portion 100 and the connection parts 102a of the unit area UAa. In other words, in the unit area UAb, the connection part 102b may have the belt shape curved in at least two directions different from each other. For example, the connection part 102b may include a first portion curved from the main portion 100 in the counter-clockwise direction and a second portion connected to the first portion and curved in the clockwise direction. The connection part 102b of the unit area UAb has almost the same shape as the connection part 102a of the unit area UAa. Therefore, a detailed description for the connection part 102b is omitted.

Referring to FIG. 2, the unit area UAa and the unit area UAb adjacent to each other are connected through a bridge BR. Each bridge BR may include one connection part 102*a* of the unit area UAa and one connection part 102*b* of an adjacent unit area UAb. On the boundary between the unit area UAa and the unit area UAb adjacent to each other, the end portion of the connection part 102*a* of the unit area UAa and the end portion of the connection part 102*b* of the unit area UAb are connected to each other. The inner edge of the center portion of the connection part 102*a* and the connection part 102*b* connected to each other may form a curved line having the curvature radius R2.

Figure 4:
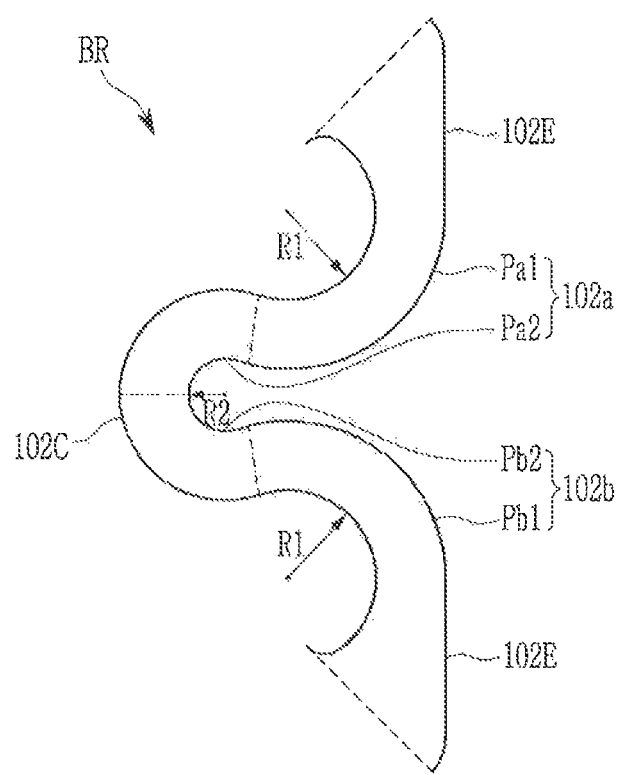
FIG. 4 is a top plan view of a bridge of a display device according to an exemplary embodiment of the present invention.

Referring to FIG. 4, one bridge BR may include a center curved part 102C having the curvature radius R2 and a pair of outer curved parts 102E having the curvature radius R1. The outer curved parts 102E of the bridge BR are respectively connected to ends of the center curved part 102C of the bridge BR. The center curved part 102C of the bridge BR is formed of the second portion Pa2 of the connection part 102*a* and the second portion Pb2 of the connection part 102*b* and may be curved while having the inner edge of the curvature radius R2. Each of the outer curved parts 102E of the bridge BR is formed of the first portion Pa1 of the connection part 102*a* and the first portion Pb1 of the connection part 102*b*, and may be curved while having the inner edge of the curvature radius R1. The curve direction of the center curved part 102C and the curve direction of the pair of outer curved parts 102E may be different from each other. In other words, if the center of the curvature radius of the inner edge of the center curved part 102C is disposed on a first side of the bridge BR, the center of the curvature radius of the inner edge of the outer curved parts 102E may be disposed on a second side opposite to the first side of the bridge BR.

Accordingly, the bridge BR connecting two adjacent main portions 100 may have the belt shape including the curved part 102C curved in at least two different directions. The curve directions of the pair of outer curved parts 102E of the bridge BR are the same as each other, but are different from the curve direction of the center curved part 102C.

Each bridge BR may have the symmetrical shape in the first direction DR1 and/or the second direction DR2.

Again referring to FIG. 2, the bridges BR connecting the adjacent main portions 100 may include the bridges BR11, BR12, BR21, and BR22 having the symmetrical shape. The bridges BR11, BR12, BR21, and BR22 may have shapes that are rotated with respect to each other by 90 degrees.

The bridge BR11 and the bridge BR12 may mainly extend in the first direction DR1, and may connect the main portions 100 adjacent to each other in the first direction DR1. The bridge BR11 and the bridge BR12 may have shapes that are symmetrical to each other based on a reference line parallel to the first direction DR1.

The bridge BR21 and the bridge BR22 may mainly extend in the second direction DR2, and may connect the main portions 100 adjacent to each other in the second direction DR2. The bridge BR21 and the bridge BR22 may have shapes that are symmetrical to each other based on a reference line parallel to the second direction DR2.

Two main portions 100 adjacent to each other or two bridges BR adjacent to each other are separated from each other such that a gap GAP is formed between, the two main portions 100 or the two bridges BR. The width W3 of the gap GAP is larger than 0.

Four bridges BR connected to one main portion 100 may have the shapes that are symmetrically positioned with respect to each other by 90 degrees, 180 degrees, 270 degrees, or 360 degrees.

Again referring to FIG. 2, the display device 1000 includes a substrate 110, and the plan shape of the substrate 110 may be the same as the plan shape of the display device 1000. In other words, the plan shape of the substrate 110 may be the same as the plan shape of the main portion 100 and the bridge BR as above-described. The substrate 110 may be removed in an area except for the main portion 100 and the bridge BR.

A driving circuit such as gate drivers 400*a* and 400*b*, a data driver 500, etc. may be disposed in the peripheral area PA.

The gate drivers 400*a* and 400*b* may be connected to gate lines among the signal lines disposed in the display area DA to transmit a gate signal. The gate drivers 400*a* and 400*b* may be simultaneously formed in the same process as that of the transistors disposed in the display area DA. One of the gate drivers 400*a* and 400*b* disposed on the left or the right of the display area DA may be omitted.

The data driver 500 is connected to data lines among the signal lines disposed on the display area DA to transmit a data signal. The data driver 500 may include a driving circuit chip bonded on the display device 1000.

As above-described, according to an exemplary embodiment of the present invention, in the display area DA, the plurality of main portions 100 in which the light emitting element LE is disposed are connected to each other through the bridge BR curved in at least two directions that are different from each other. As described later, due to the bridge BR according to the present exemplary embodiment, the deformation ability such as the elongation (e.g., stretching) or the contraction of the display device 1000 may be increased such that the light emitting element LE and the electrical elements of the main portion 100 may not be damaged.

Now, the structure of the display device according to an exemplary embodiment of the present invention is described with reference to FIG. 5 to FIG. 12 as well as the above-described drawings.

Figure 5:
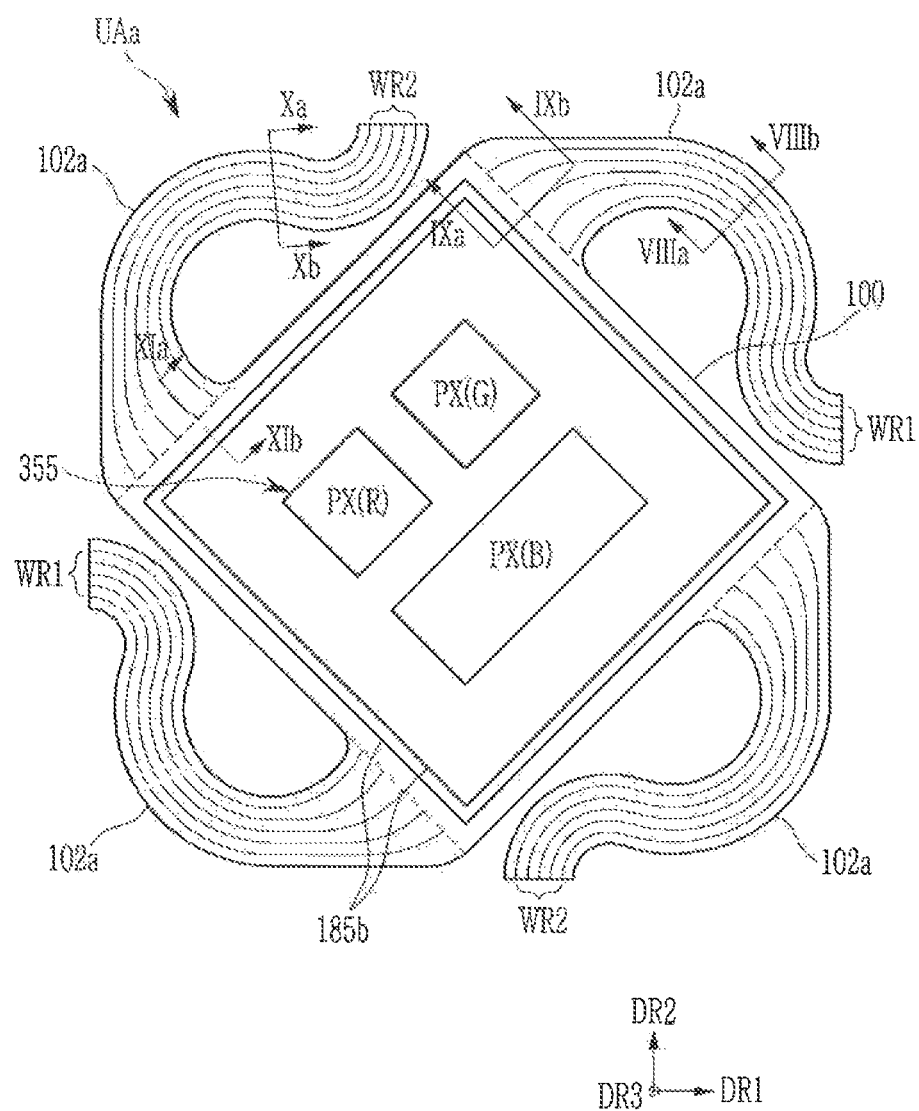
FIG. 5 is a top plan view of a unit area disposed in a display area of a display device according to an exemplary embodiment of the present invention.

Referring to FIG. 5, in one unit area UA (e.g., one unit area UAa), at least one pixel PX may be disposed in the main portion 100. Each pixel PX may include the above-described light emitting element LE and the electrical element such as the transistor. Each pixel PX may have one light emission area from which light is emitted as a unit for displaying an image.

FIG. 5 shows an example in which a plurality of pixels red (R), green (G), and blue (B) are disposed as an example of a plurality of pixels PX disposed in one main portion 100. In FIG. 5, the area indicated by a quadrangle inside the main portion 100 may correspond to the light emission area of each pixel R, C, and B. The pixels R, G, and B disposed in one main portion 100 may emit light of colors that are different from each other. Alternatively, at least two pixels PX disposed in one main portion 100 may emit light of colors that are substantially the same as each other.

A plurality of wirings WR1 and WR2 may be disposed in the connection part 102*a*. Each wiring WR1 and WR2 may include at least one signal line connected to the electrical. element and/or the transistor of the main portion 100.

The wiring WR1 of which the end portion is disposed at the connection part 102*a* toward the first direction DR1 mainly extends in the first direction DR1, and the wiring WR2 of which the end portion is disposed at the connection part 102*a* toward the second direction DR2 mainly extends in the second direction DR2.

A part of the signal lines included in the wiring WR1 may transmit a signal of a different kind from the signal transmitted by the signal lines included in the wiring WR2. For example, the wiring WR1 may include at least one gate line for transmitting the gate signal and the wiring WR2 may include at least one data line for transmitting the data signal.

The two wirings WR1 and WR2 may include at least one voltage transmitting line. For example, the two wirings WR1 and WR2 may include a driving voltage line for transmitting the first voltage (e.g., a driving voltage ELVDD) and/or a voltage transmitting line transmitting the second voltage (e.g., a common voltage ELVSS) different from the first voltage.

An example of the structure of the pixel PX and an example of the lamination structure of the display device are described with reference to FIG. 6 and FIG. 7 as well as FIG. 5.

The substrate 110 may be made of an insulating material. The substrate 110 may include a material having flexibility. For example, the substrate 110 may be made of various organic materials such as PET, PEN, PC, PAR, PEI, PES, or PI, a metal thin film, or a glass thin film. The substrate 110 may have a singular structure or a multi-layered structure.

A buffer layer 120 may be disposed on the substrate 110, and an active pattern 130 may be disposed on the buffer layer 120. The active pattern 130 may include channel areas 131a, 131b, 131c_1, 131c_2, 131d_1, 131d_2, 131e, 131f, and 131g respectively forming each channel of a plurality of transistors T2, T3_1, T3_2, T4_1, T4_2, T5, T6, and T7 included in one pixel PX, and a conductive area. The conductive area of the active pattern 130 may include source areas 136a, 136b, 136c_1, 136c_2, 136d_1, 136d_2, 136e, 136f, and 136g and drain areas 137a, 137b, 137c_1, 137c_2, 137d_1, 137d_2, 137e, 137f, and 137g disposed on both sides of the channel areas 131a, 131b, 131c_1, 131c_2, 131d_1, 131d_2, 131e, 131f, and 131g.

The active pattern 130 may include amorphous silicon, polysilicon, an oxide semiconductor material, etc.

A first insulating layer 141 may be disposed on the active pattern 130, and a first conductive layer may be disposed on the first insulating layer 141. The first conductive layer may include a plurality of gate lines 151, 152, 153, and 154, and a driving gate electrode 155a.

The gate lines 151, 152, 153, and 154 may mainly extend in the first direction DR1, and may be connected to the above-described gate drivers 400a and 400b. The gate lines 151, 152, and 154 may transmit a gate signal scanned in the second direction DR2 or the direction opposite thereto in the display area DA. The gate line 154, which is a gate line of substantially the same kind as the gate line 152, may transmit a gate signal of a next stage after the gate signal transmitted by the gate line 152. The gate line 153 may be referred to as a control line, and may transmit a signal of a different waveform at a different timing from the signals of the gate lines 151, 152, and 154.

The active pattern 130 and the plurality of gate lines 151, 152, 153, and 154, and the driving gate electrode 155a overlapping thereto, may form the plurality of transistors T1, T2, T3_1, T3_2, T4_1, T4_2, T5, T6, and T7, The first transistor T1 includes the channel area 131a, the source area 136a and a drain area 137a, and the driving gate electrode 155a overlapping the channel area 131a. The second transistor T2 includes the channel area 131b, the source area 136b and a drain area 137b, and a gate electrode 155b as a part of the gate line 151 overlapping the channel area 131b. The third transistor (T3_1 and T3_2) may include sub-transistors T3_1 and T3_2 connected to each other. The sub-transistor T3_1 includes the channel area 131c_1, the source area 136c_1 and a drain area 137c_1, and a gate electrode 155c_1 as a part of the gate line 151 overlapping the channel area 131c_1. The sub-transistor T3_2 includes the channel area 131c_2, the source area 136c_2 and a drain area 137c_2, and a gate electrode 155c_2 as a part of the gate line 151 overlapping the channel area 131c_2. The fourth transistor (T4_1 and T4_2) may include sub-transistors T4_1 and T4_2 connected to each other. The sub-transistor T4_1 includes the channel area 131d_1, the source area 136d_1 and a drain area 137d_1, and a gate electrode 155d_1 as a part of the gate line 152 overlapping the channel area 131d_1. The sub-transistor T42 includes the channel area 131d_2, the source area 136d_2 and a drain area 137d_2, and a gate electrode 155d_2 as a part of the gate line 152 overlapping the channel area 131d_2. The fifth transistor T5 includes the channel area 131e, the source area 136e and a drain area 137e, and a gate electrode 155e as a part of the gate line 153 overlapping the channel area 131e. The sixth transistor T6 includes the channel area 131f, the source area 136e and a drain area 137f, and a gate electrode 155e as a part of the gate line 153 overlapping the channel area 131f. The seventh transistor T7 includes the channel area 131g, the source area 136g and a drain area 137g, and a gate electrode 155g as a part of the gate line 154 overlapping the channel area 131g.

A second insulating layer 142 may be disposed on the first conductive layer and the first insulating layer 141, and a second conductive layer may be disposed on the second insulating layer 142. The second conductive layer may include a storage line 156 and an initialization voltage line 159 for transmitting an initialization voltage. The storage line 156 may include an expansion part 157 disposed in each pixel PX. Part of the expansion part 157 may be removed to form an opening 51.

A third insulating layer 160 may be disposed on the second conductive layer and the second insulating layer 142.

At least one of the buffer layer 120, the first insulating layer 141, the second insulating layer 142, and the third insulating layer 160 may include the inorganic insulating material such as a silicon nitride (SiNx), a silicon oxide (SiOx), a silicon oxynitride (SiON), and/or the organic insulating material. Part or all of the first insulating layer 141, the second insulating layer 142, and the third insulating layer 160 may include a plurality of contact holes 61, 62, 63, 64, 65, 67, 68, and 69.

The third conductive layer may be disposed on the third insulating layer 160. The third conductive layer may include a data line 171, a driving voltage line 172, and a plurality of connecting members 174, 175, and 179.

The data line 171 and the driving voltage line 172 mainly extend in the second direction DR2, thereby crossing the plurality of gate lines 151, 152, 153, and 154.

One part of the connecting member 174 may be connected to the driving gate electrode 155a through the opening 51 of the expansion part 157 of the storage line 156 and the contact hole 61 in the opening 51. Another part of the connecting member 174 may be connected to the drain area 137c_1 of the sub-transistor T3_1 of the third transistor T3 and the drain area 137d_1 of the sub-transistor T4_1 of the fourth transistor T4 through the contact hole 63. The connecting member 175 may be connected to the initialization voltage line 159 through the contact hole 64, and may be connected to the drain area 137g of the seventh transistor T7 through the contact hole 65. The connecting member 179 may be connected to the drain area 137f of the sixth transistor T6 through the contact hole 69. The data line 171 may be connected to the source area 136b of the second transistor T2 through the contact hole 62, and the driving voltage line 172 may be connected to the source area 136e of the fifth transistor T5 through the contact hole 67 and the expansion part 157 of the storage line 156 through the contact hole 68. Accordingly, the expansion part 157 of the storage line 156 may receive the driving voltage ELVDD of the driving voltage line 172.

The third conductive layer may further include a voltage transmitting line for transmitting the second voltage (e.g., a common voltage ELVSS) that is different from the first voltage.

At least one of the first conductive layer, the second conductive layer, and the third conductive layer may include a conductive material such as copper (Cu), silver (Ag), aluminum (Al), molybdenum (Mo), titanium (Ti), tantalum (Ta), or alloys of at least two thereof.

The driving gate electrode 155a and the expansion part 157 of the storage line 156 overlapping each other via the second insulating layer 142 may form the capacitor Cst.

A first passivation layer 180a as a fourth insulating layer and a second passivation layer 180b as a fifth insulating layer may be disposed on the third conductive layer and the third insulating layer 160. The first passivation layer 180a may include the inorganic insulating material such as a silicon nitride (SiNx), a silicon oxide (SiOx), a silicon oxynitride (SiON), etc. The second passivation layer 180b may include an organic insulating material such as a polyacryl-based resin and a polyimid-based resin.

The first and second passivation layers 180a and 180b may include a contact hole 89 formed on the connecting member 179.

The fourth conductive layer may be disposed on the first and second passivation layers 180a and 180b. The fourth conductive layer may include a semi-transparent conductive material or a reflective conductive material.

The fourth conductive layer may include a first electrode 191. One first electrode 191 may be disposed in each pixel PX, but the present invention is not limited thereto. The first electrode 191 is referred to as a pixel electrode. The first electrode 191 may be electrically connected to the connecting member 179 through the contact hole 89, thereby receiving the data voltage.

The fourth conductive layer may further include a conductive pattern 192. The conductive pattern 192 may be curved along the edge of the first electrode 191. The conductive pattern 192 may transmit an initialization voltage. The conductive pattern 192 may be omitted.

A sixth insulating layer 350 may be disposed on the second passivation layer 180b and the fourth conductive layer. Part of the sixth insulating, layer 350 disposed on the first electrode 191 may be removed, thereby forming an opening 355 overlapping the first electrode 191. The sixth insulating layer 350 may include the organic insulating material such as the polyacryl-based resin and the polyimide-based resin. The sixth insulating layer 350 may be transparent or opaque, and may include a pigment such as carbon black.

An emission layer 370 is disposed on the first electrode 191. The emission layer 370 may include a portion disposed in the opening 355 of the sixth insulating layer 350. The emission layer 370 may include at least one of an organic light emission material, an inorganic light emission material, a quantum dot material, etc. In a plan view, the area of the opening 355 may correspond to the light emission area which is an area where each pixel PX emits light.

A second electrode 270 may be disposed on the emission layer 370. The second electrode 270 may be continuously formed throughout the plurality of pixels PX or throughout the plurality of unit areas UA, and may be referred to as a common electrode. The second electrode 270 may include the conductive transparent material.

In each pixel PX, the first electrode 191, the emission layer 370, and the second electrode 270 may together form the light emitting diode (LED) ED as the light emitting element, and one of the first electrode 191 and the second electrode 270 becomes a cathode and the other becomes an anode. The light emitting diode (LED) ED is a self-illuminating element.

An encapsulation layer 380 may be disposed on the second electrode 270. The encapsulation layer 380 prevents penetration of an impurity from the outside, thereby protecting the light emitting diode (LED) ED. The encapsulation layer 380 may include at least one inorganic insulating material and/or at least one organic insulating material, and the encapsulation layer 380 may have a singular structure or a multi-layered structure. The encapsulation layer 380 with the multi-layered structure may include at least one organic insulating material layer and at least one inorganic insulating material layer, and the organic insulating material layer and the inorganic insulating material layer may in direct contact with each other.

Figure 6:
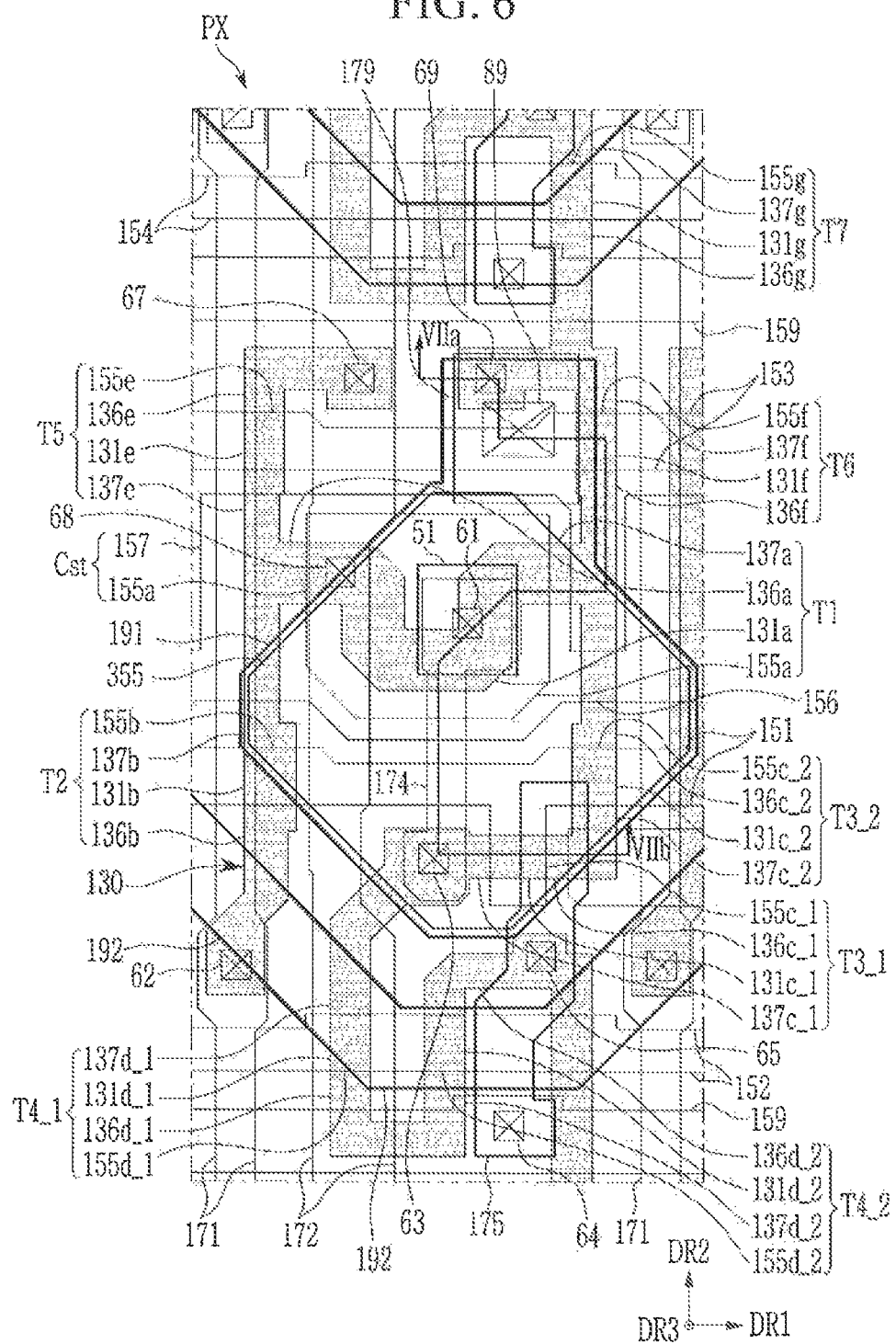
FIG. 6 is a top layout view of one pixel of a display device according to an exemplary embodiment of the present invention.
Figure 7:
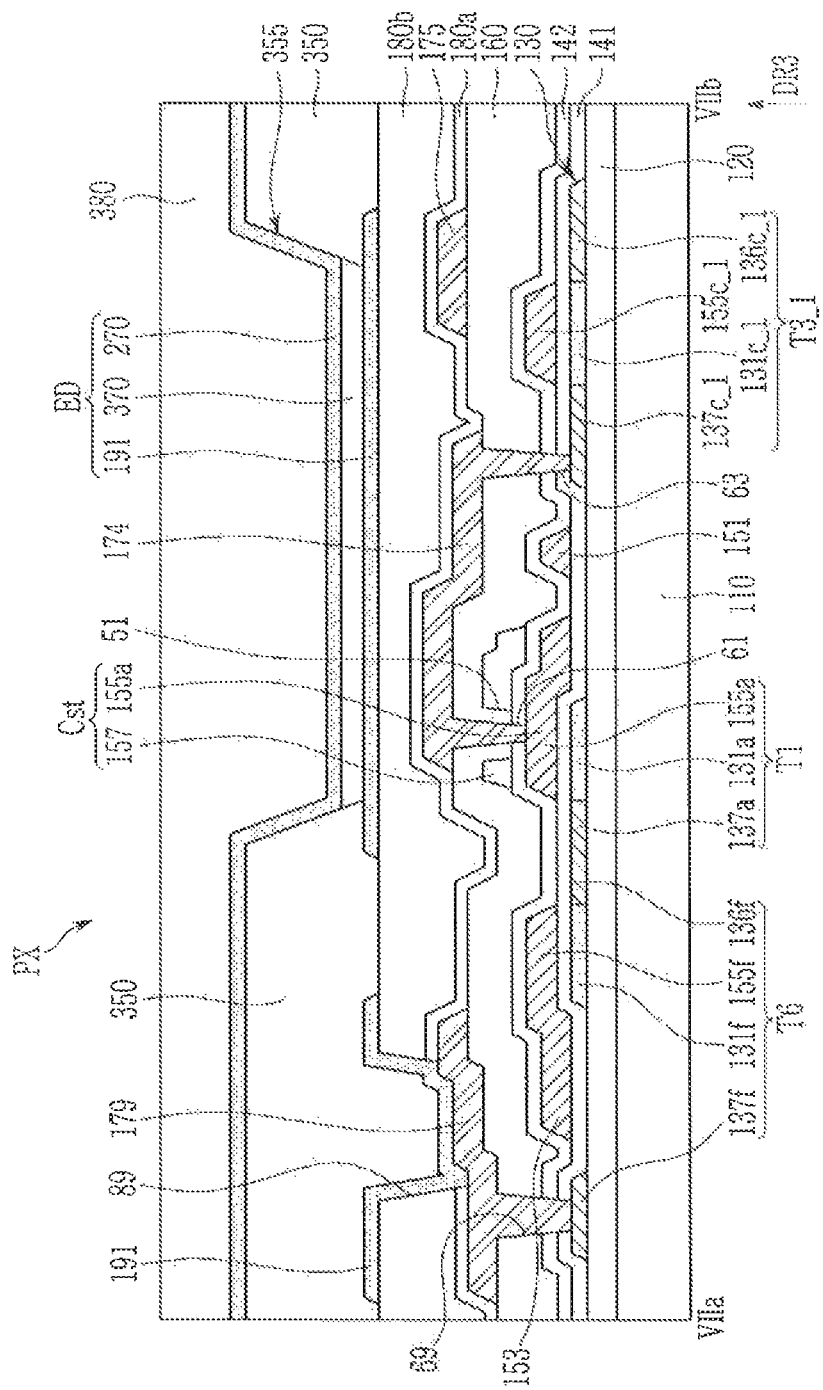
FIG. 7 is a cross-sectional view of the display device shown in FIG. 6 taken along a line VIIa-VIIb.

The structure of the pixel PX shown in FIG. 6 is merely exemplary, and the present invention is not limited thereto. For example, the pixel PX may include transistors of a number and a connection relationship that is different from as described above.

Next, the boundary between the main portion 100 and the connection parts 102a and 102b and the cross-sectional structure of the connection parts 102a and 102b are described with reference to FIG. 8 to FIG. 12 along with FIG. 5 to FIG. 7. The unit area hAa is described as one example, but the description of the unit area UAa is equally applied to the unit area UAb.

Figure 8:
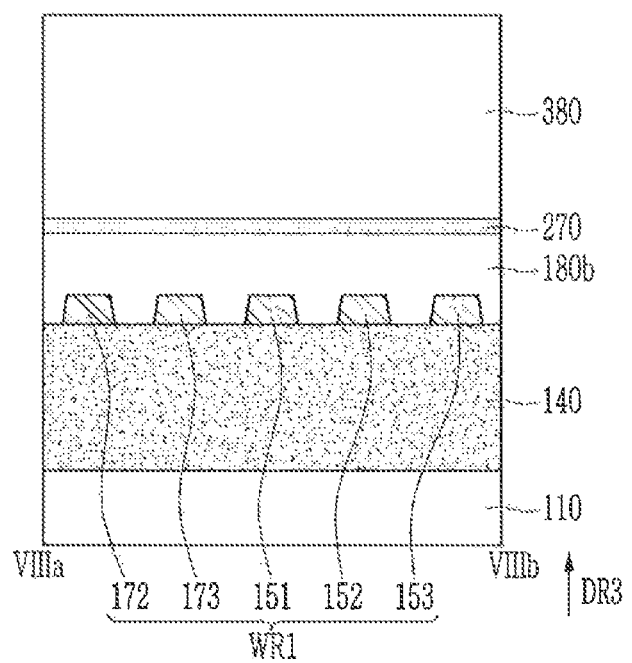
FIG. 8 is a cross-sectional view of the display device shown in FIG. 5 taken along a line VIIIa-VIIIb.
Figure 10:
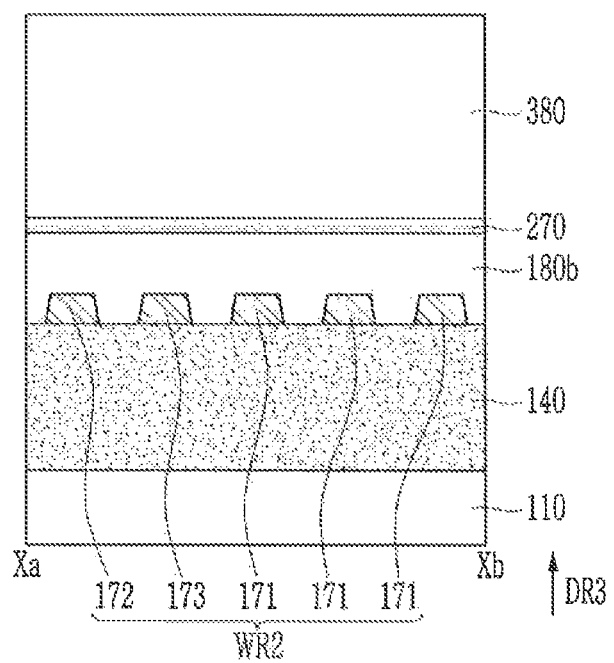
FIG. 10 is a cross-sectional view of the display device shown in FIG. 5 taken along a line Xa-Xb.

Referring to FIG. 8 and FIG. 10, the wirings WR1 and WR2 disposed in the connection part 102a may be disposed on one conductive layer, and may be disposed on the above-described third conductive layer.

Since the connection part 102a is configured to have better deformation capability than the main portion 100, a layer having a high risk of cracking during the deformation of the display device may be removed from the connection part 102a. For example, at least one of the buffer layer 120, the first insulating layer 141, the second insulating layer 142, the third insulating layer 160, and the first passivation layer 180a disposed in the main portion 100 may be removed and not exist in the connection part 102a. FIG. 8 to FIG. 11 show the example in which all of the buffer layer 120, the first insulating layer 141, the second insulating layer 142, the third insulating layer 160, and the first passivation layer 180a are removed from the connection part 102a. For example, when the buffer layer 120, the first insulating layer 141, the second insulating layer 142, the third insulating layer 160, and the first passivation layer 180a include the inorganic insulating material, since they are removed from the second connection part 102a, a risk of a crack occurring when the second connection part 102a is deformed may be reduced.

To protect the wirings WR1 and WR2 and to increase flexibility, a seventh insulating layer 140 may be disposed on the connection part 102a. The seventh insulating layer 140 is formed after the third insulating layer 160 and may be disposed under the wirings WR1 and WR2. The seventh insulating layer 140 covers the substrate 110 of the connection part 102a, thereby protecting the connection part 102a where the buffer layer 120, the first insulating layer 141, the second insulating layer 142, and the third insulating layer 160 are removed. The seventh insulating layer 140 may only be disposed on the connection part 102a, but may be removed from most of the main portion 100. In addition, in a plan view, the seventh insulating layer 140 does not overlap the transistors of the main portion 100, e.g., the active pattern 130.

Accordingly, when the connection part 102a is deformed, even if a crack occurs in the seventh insulating layer 140, the penetration of an impurity due to the crack may not progress to the main portion 100.

The seventh insulating layer 140 may cover and be in contact with at least one edge side surface of the buffer layer 120, the first insulating layer 141, the second insulating layer 142, and the third insulating layer 160 near the edge of the main portion 100, and may cover part of the upper surface of the third insulating layer 160.

The seventh insulating layer 140 may include an organic insulating material such as the polyimide-based polymer, the polyacryl-based polymer, a siloxane-used polymer, a fluorine-based carbon compound such as Teflon, a benzocyclobutene compound, etc.

In the connection part 102a, the wirings WR1 and WR2 of the third conductive layer, the second passivation layer 180b, the second electrode 270, and the encapsulation layer 380 may be sequentially stacked on the seventh insulating layer 140. Alternatively, the second electrode 270 may be removed and not exist on the connection part 102a. In addition, the encapsulation layer 380 may be removed and not exist on the connection part 102a. Further, the sixth insulating layer 350 may be disposed between the second passivation layer 180b and the second electrode 270 on the connection part 102a.

The insulating layer that is in contact over and under the wirings WR1 and WR2 may include an organic insulating material. In other words, the seventh insulating layer 140 including the organic insulating material may be disposed directly under the wirings WR1 and WR2, and the second passivation layer 180b including the organic insulating material may be disposed directly on the wirings WR1 and WR2. Accordingly, compared to a case in which the inorganic insulating layer is disposed directly over or under the wirings WR1 and WR2, the probability of cracks occurring in the organic insulating layer adjacent to the wirings WR1 and WR2 is low. Moreover, an influence such as the penetration of the impurity such as moisture on the wirings WR1 and WR2 may be prevented.

The wiring WR1 may include the driving voltage line 172, a voltage transmitting line 173, and the gate lines 151, 152, and 153 as above-described. The gate lines may also include the above-described gate line 154. The wiring WR1 may not include the driving voltage line 172 and/or the voltage transmitting line 173. The number of gate lines 151, 152, and 153 included in the wiring WR1 may be changed depending on the number of transistors included in the pixel PX disposed in the main portion 100.

The wiring WR2 may include the driving voltage line 172, the voltage transmitting line 173, and at least one data line 171. FIG. 5 shows the example in which three pixels R, C, and B are disposed on one main portion 100, such that the wiring WR2 may include three data lines 171 as an example. The number of data lines 171 included in the wiring WR2 may be changed depending on the number of pixels PX disposed on the main portion 100.

Figure 9:
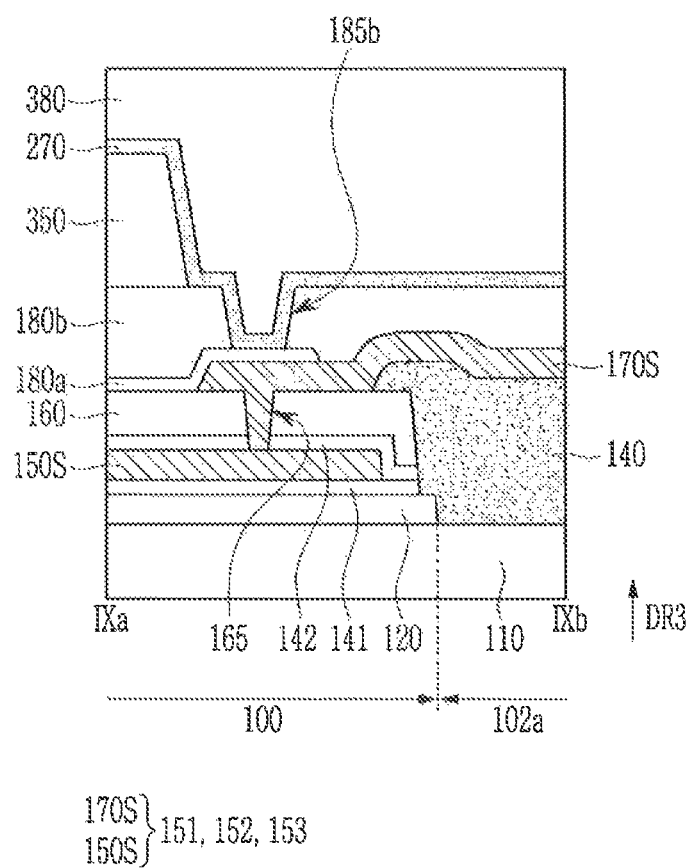
FIG. 9 is a cross-sectional view of the display device shown in FIG. 5 taken along a line IXa-IXb.
Figure 11:
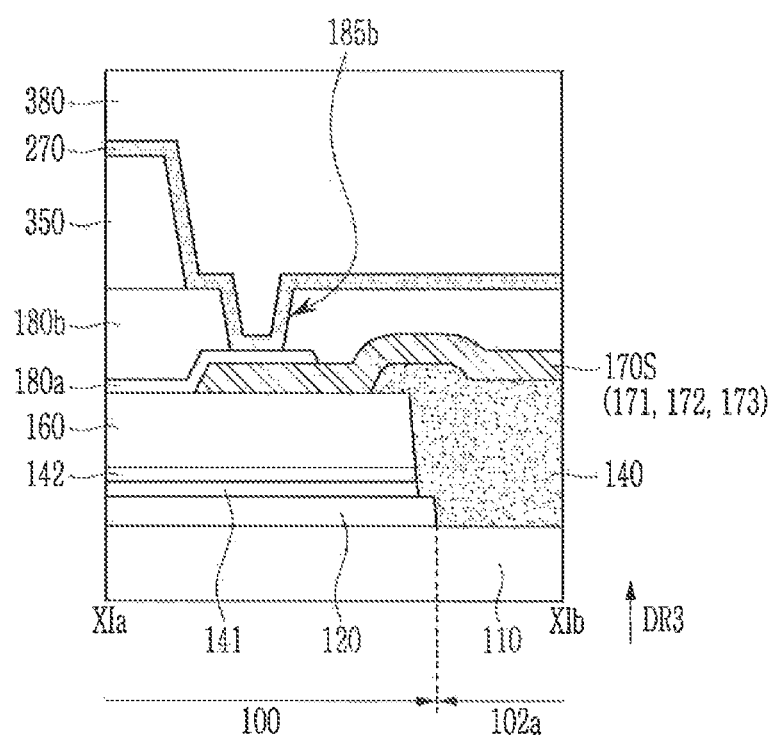
FIG. 11 is a cross-sectional view of the display device shown in FIG. 5 taken along a line XIa-XIb.

Referring to FIG. 9 and FIG. 11, as described above, the first insulating layer 141, the second insulating layer 142, the third insulating layer 160, and the first passivation layer 180a are disposed on the main portion 100, and may be removed and not exist on the connection part 102a. Accordingly, there is no possibility of cracks being generated in the first insulating layer 141, the second insulating layer 142, the third insulating layer 160, and the first passivation layer 180a on the connection part 102a. As a consequence, there is no possibility that such crack would be transmitted to the main portion 100. Accordingly, the ability of the connection part 102a to be deformed may be increased without damaging the display device.

The outermost side surface of the first insulating layer 141, the second insulating layer 142, the third insulating layer 160, and the first passivation layer 180a may almost correspond with the boundary between the main portion 100 and the connection part 102a, or may be disposed inside the connection part 102a closer to the boundary between the main portion 100 and the connection part 102a.

Referring to FIG. 5, FIG. 9, and FIG. 11, the second passivation layer 180b is also disposed on the connection part 102a as above-described, however part of the second passivation layer 180b may be removed near the boundary between the main portion 100 and the connection part 102a, thereby forming a groove 185b as a hole, The groove 185b may be formed on the first passivation layer 180a and may expose the first passivation layer 180a. The second passivation layer 180b may not exist in the groove 185b. However, the present invention is not limited thereto, and some of the second passivation layer 180b may remain in the groove 185b.

In a plan view, the groove 185b is disposed on the main portion 100, however the groove 185b may be disposed near the boundary between the main portion 100 and the connection part 102a and extend along the edge of the main portion 100. The groove 185b may be continuously formed along the edge of the main portion 100, thereby forming a closed-loop shape. The groove 185b may enclose the electrical element and the light emitting element disposed on the main portion 100. The second passivation layer 180b disposed on the main portion 100 and the second passivation layer 18011 disposed on the second connection part 102a may be physically separated by the groove 185b. Accordingly, when the connection part 102a is deformed, even if a crack is generated in the second passivation layer 180b, the penetration of an impurity due to the crack may not progress to the main portion 100.

In the groove 185b, the second electrode 270 may be in contact with the upper surface of the first passivation layer 180a. The first passivation layer 180a may be disposed between the third conductive layer 170S and the second electrode 270 so that the third conductive layer 170S and the second electrode 270 are not electrically connected to each other.

Referring to FIG. 5 and FIG. 9, the wiring WR1 may be disposed in the above-described third conductive layer 170S on the connection part 102a. At least part of the wiring WR1 may be disposed in the conductive layer that is different from the third conductive layer 170S on the main portion 100, and the wiring WR1 may be the gate lines 151, 152, and 153 above-described, for example. The gate lines 151, 152, and 153 may be disposed in the first conductive layer 150S on the main portion 100. The third conductive layer 170S and the first conductive layer 150S of the gate lines 151, 152, and 153 may be electrically connected to each other through a contact hole 165 of the second insulating layer 142 and the third insulating layer 160 near the edge of the main portion 100.

Referring to FIG. 5 and FIG. 11, the wiring WR2 may be disposed in the above-described third conductive layer 170S on the connection part 102a. At least part of the wiring WR2 may also be disposed in the third conductive layer 170S on the main portion 100, and the wiring WR2 may be the data line 171, the driving voltage line 172, and the voltage transmitting line 173 as above-described, for example. In other words, among the wiring WR2, the data line 171, the driving voltage line 172, or the voltage transmitting line 173 may cover the boundary where the edge portion of the seventh insulating layer 140 meets the third insulating layer 160 near the boundary between the main portion 100 and the connection part 102a. In addition, among the wiring WR2, the data line 171, the driving voltage line 172, or the voltage transmitting line 173 may be continuously formed on the main portion 100 and the connection part 102a. Among the wiring WR2, the data line 171, the driving voltage line 172, or the voltage transmitting line 173 may be in contact with the third insulating layer 160 on the main portion 100, and may be in contact with the upper surface of the seventh insulating layer 140 on the connection part 102a.

The driving voltage line 172 and the voltage transmitting line 173 included in the wiring WR2 may also have the cross-sectional structure shown in FIG. 11. In other words, the driving voltage line 172 and the voltage transmitting line 173 included in the wiring WR2 may be disposed in the third conductive layer 170S on both of the connection part 102a and the main portion 100, and may be in contact with the upper surface of the seventh insulating layer 140 and the upper surface of the third insulating layer 160.

The second electrode 270 may be electrically connected to the voltage transmitting line 173 through the contact hole of the second passivation layer 180b on the connection parts 102a and 102b, or may be electrically connected to the voltage transmitting line 173 through the contact hole of the insulating layer between the second electrode 270 and the voltage transmitting line 173 on the main portion 100, thereby receiving the second voltage.

Figure 12:
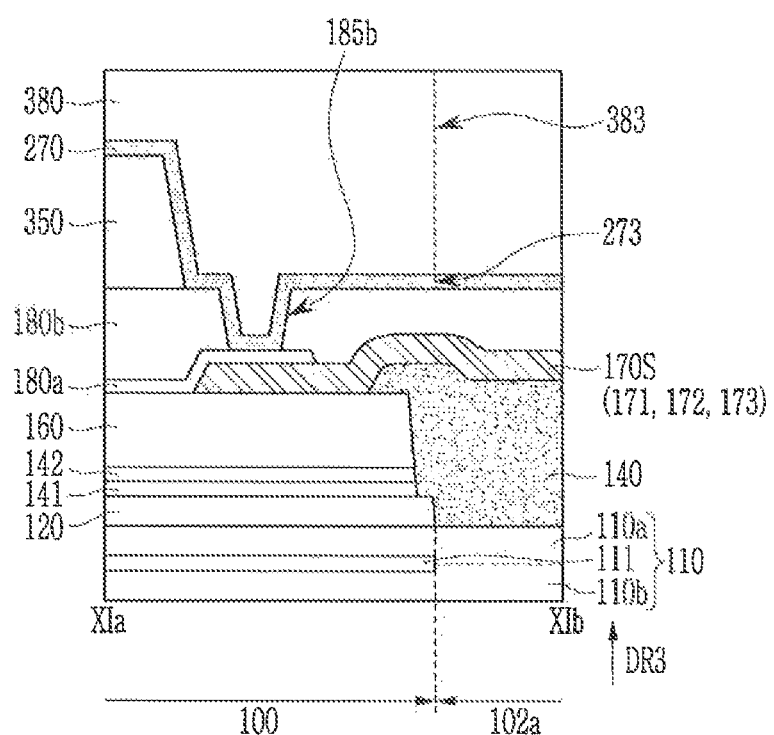
FIG. 12 is a cross-sectional view of the display device shown in FIG. 5 taken along the line XIa-XIb.

FIG. 12 shows an example in which the substrate 110 has the multi-layered structure. For example, the substrate 110 may include the plurality of organic insulating material layers 110a and 110b made of a material such as polyimide (PI), and at least one barrier layer 111 disposed between two adjacent organic insulating material layers 110a and 110b. The barrier layer 111 may include the inorganic insulating material such as a silicon nitride (SiNx), a silicon oxide (SiOx), a silicon oxynitride (SiON), etc. The organic insulating material layers 110a and 110b and the barrier layer 111 may be alternately stacked in the third direction DR3 in a cross-sectional view. When the substrate 110 includes the barrier layer 111, the barrier layer 111 may be disposed on the main portion 100 and may be removed at the connection part 102a. As described above, since the barrier layer 111 is removed at the connection part 102a, defects such as a crack may be reduced at the connection part 102a.

FIG. 12 shows an example in which the second electrode 270 and the encapsulation layer 380 are removed from the connection part 102a as above-described. In other words, the second electrode 270 may be disposed on the connection part 102a, and a portion of the second electrode 270 to the right of an incision surface 273 is removed. Similarly, the encapsulation layer 380 may be disposed on the connection part 102a, and a portion of the encapsulation layer 380 to the right of an incision surface 383 is removed.

The effect of the bridge BR of the display device according to the above-described exemplary embodiments will now be described with reference to FIG. 13 to FIG. 17 as well as the above-described drawings.

Figure 13:
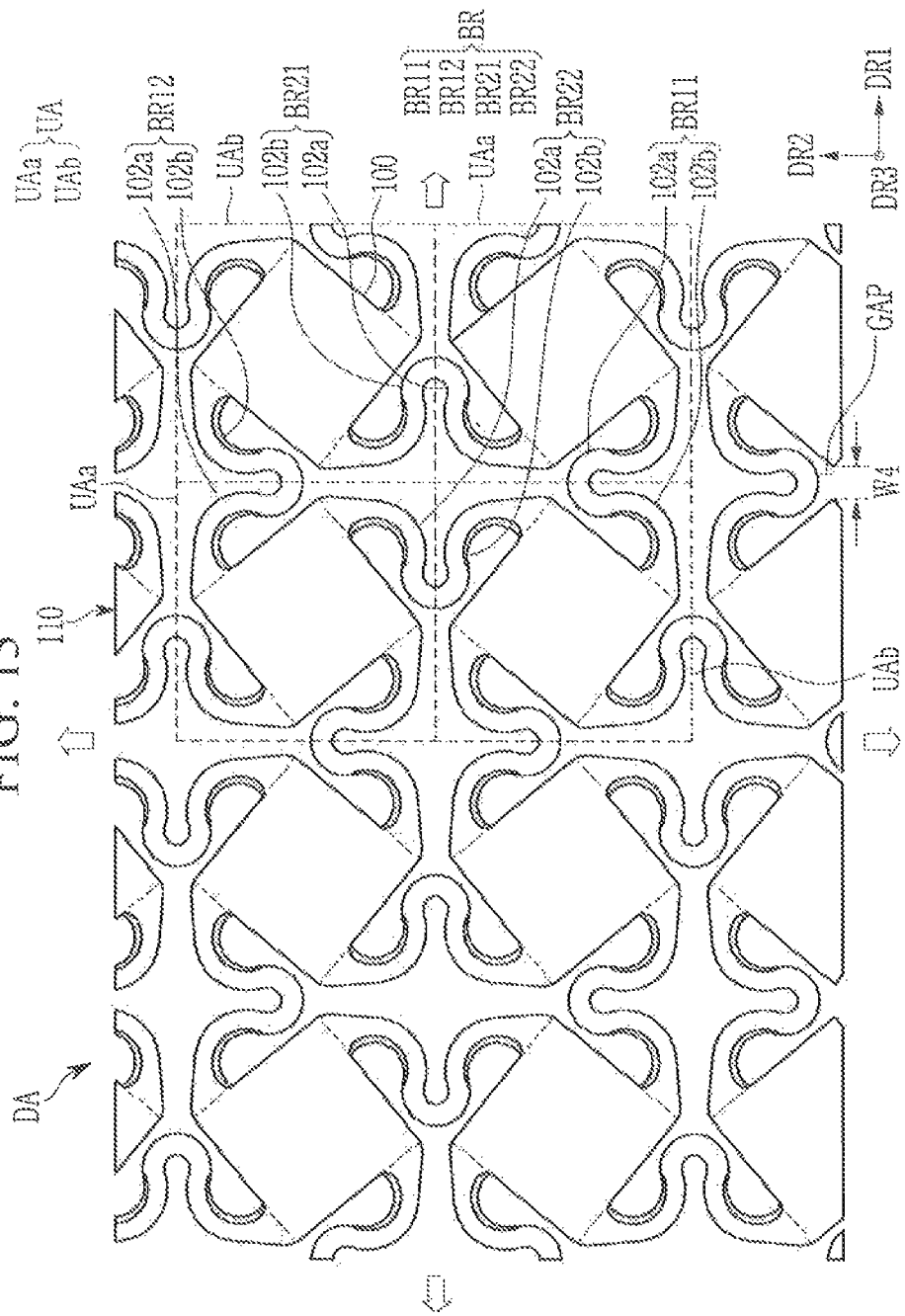
FIG. 13 is a view showing a biaxial elongated state of a display area of a display device shown in FIG. 2, FIG. 14 and FIG. 15 are views showing a deformation rate and a maximum elongation rate when elongating a display device according to several exemplary embodiments of the present invention.

FIG. 13 shows the shape of the biaxial stretching in which the display device is pulled from both sides of the direction parallel to the first direction DR1 and from both sides of the direction parallel to the second direction DR2.

Referring to FIG. 13, if at least part of the display area DA of the display device according to the above-described exemplary embodiment shown in FIG. 2 is stretched (e.g., elongated), the interval (e.g., the gap GAP) between the adjacent main portions 100 is increased and the bridge BR may be deformed such as by bending. In other words, if the display area DA of the display device is stretched, the width W4 of the gap GAP is larger than the width W3 of the original state of the display device. Therefore, the interval between the two connection parts 102a and 102b of each of the bridges BR11, BR12, BR21, and BR22 may be increased.

When the display area DA is stretched, the main portion 100 may be rotated in the plan view according to the deformation of the bridge BR. For example, the unit area UAa may be rotated from its original position in the clockwise direction, and the unit area UAb may be rotated from its original position in the counterclockwise direction.

In contrast, if at least part of the display area DA contracts (e.g., decreases), the interval (e.g., the gap GAP) between the adjacent main portions 100 is decreased, and the bridge BR may be deformed such as by bending.

The bridge BR includes the plurality of curved parts (e.g., the above-described, center curved part 102C, and pair of outer curved parts 102E) such that the bridge BR may be further smoothly bent. In this case, as shown in FIG. 13, the shape of the main portion 100 may almost not be deformed compared with the bridge BR. Accordingly, even if the display area DA is stretched or contracts, the electrical element and the light emitting element disposed on the main portion 100 may be prevented from being damaged. Accordingly, the deformation ability such as the stretching or the contraction of the display device may be increased.

The case in which at least part of the display area DA is stretched or contracts may refer to a case in which the display device is bent, rolled, or folded. The stretching or contracting of the display area DA may be a single stretch/contract in which deformation occurs at both sides of one direction, or a biaxial or multiple stretch/contract in Which deformation occurs at both sides of two or more directions (e.g., equivalent to as shown in FIG. 13). For example, the stretch or contract direction of the display area IDA may be at least one direction of the first direction DR1 and the second direction DR2, or the direction that is not parallel to the first direction DR1 and the second direction DR2, for example, a diagonal direction.

Figure 14:
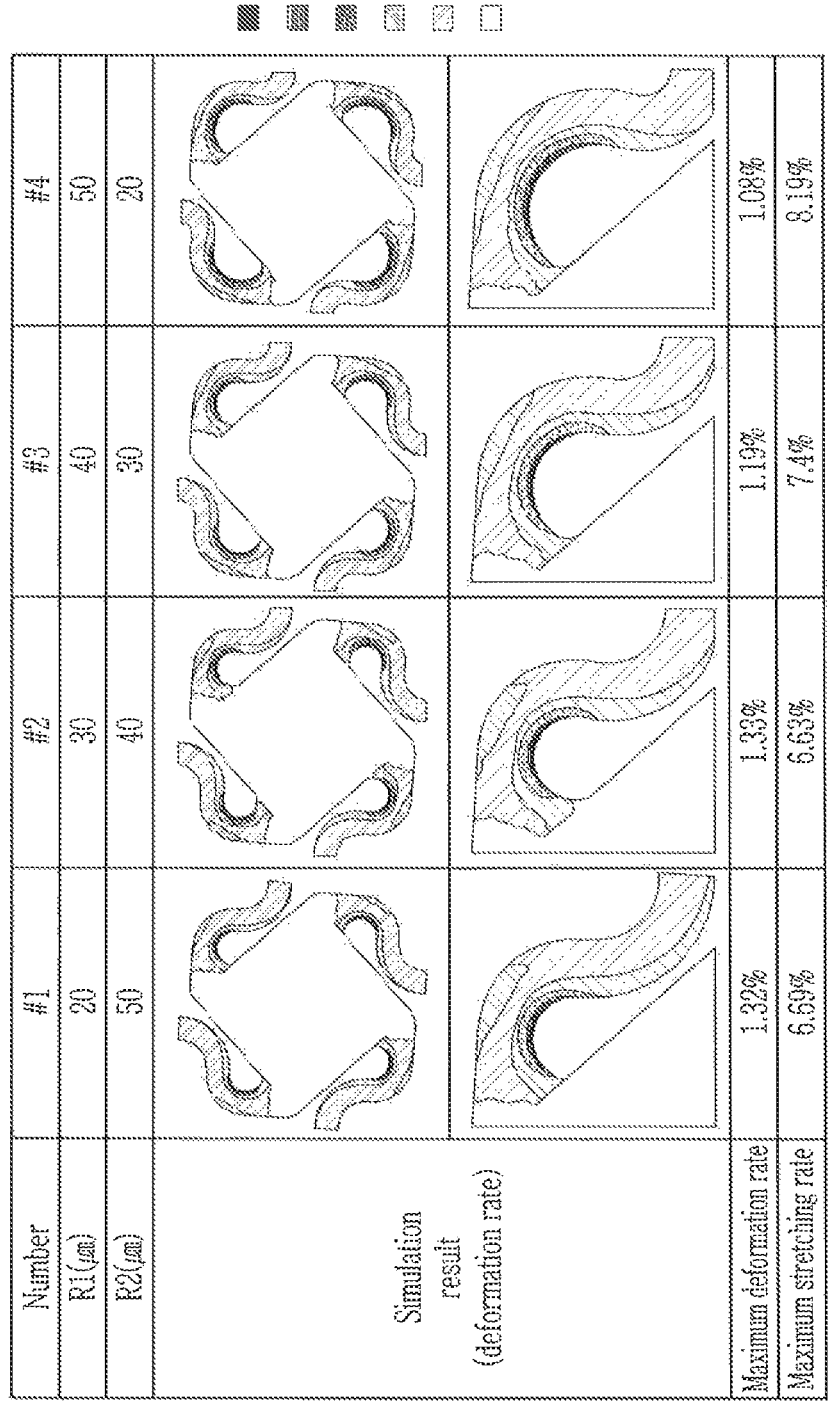
Figure 15:
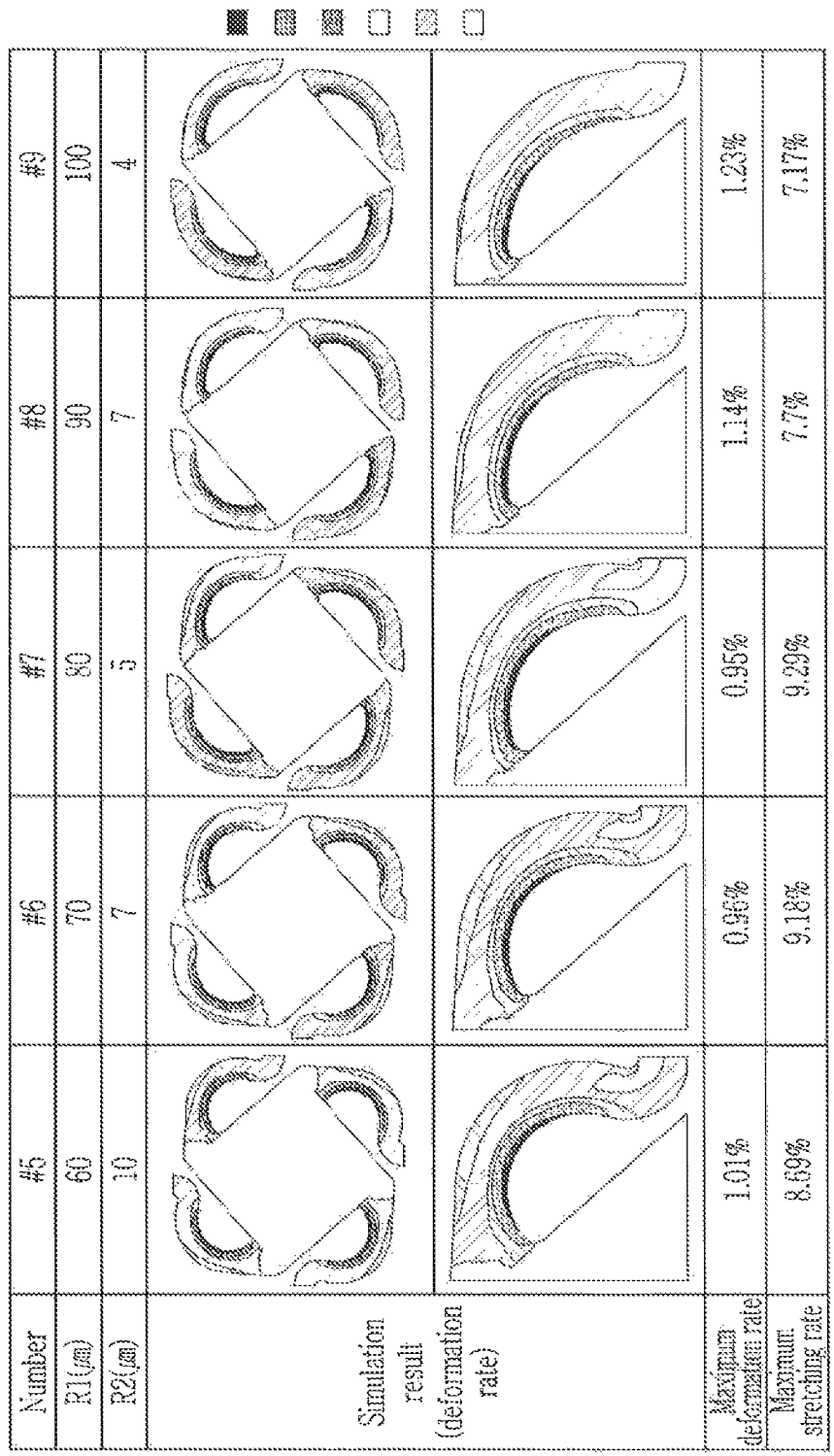

FIG. 14 and FIG. 15 show the deformation rate (e.g., strain) of the bridge BR for various curvature radii R1 and curvature radii R2 as a gray, and a maximum deformation rate (e.g., maximum strain) of the bridge BR and a maximum stretching rate (e.g., a maximum elongation) of the display area DA as a number when pulling the display area DA of the display device in the first direction DR1 and the second direction DR2 so that the display device is stretched by 5%, as shown in FIG. 13. For example, FIG. 14 and FIG. 15 show the changes of the deformation rate of the bridge BR and the maximum stretching rate of the display area DA when the curvature radius R1 increases and the curvature radius R2 decreases, respectively. When the maximum deformation rate described in FIG. 14 and FIG. 15 is small, the stress applied to the bridge BR is small. Therefore, it may be understood that the ability of the display area DA to be stretched without damage is large as the maximum stretching rate is large.

Referring to FIG. 14 and FIG. 15, as the curvature radius R1 increases and the curvature radius R2 decreases, it can be seen that the maximum deformation rate of the bridge BR somewhat decreases and the maximum stretching rate of the display area DA increases. However, in a case in which the difference between the curvature radius R1 and the curvature radius R2 is quite large (e.g., larger than about 50 micrometers) and the curvature radius R1 is 90 micrometers or more, the maximum deformation rate of the bridge BR increases, and thus, the maximum stretching rate decreases, in other words, to obtain a desirable stretching ability, the curvature radius R1 of the bridge BR of the display device according to an exemplary embodiment of the present invention may be less than 90 micrometers.

Figure 16:
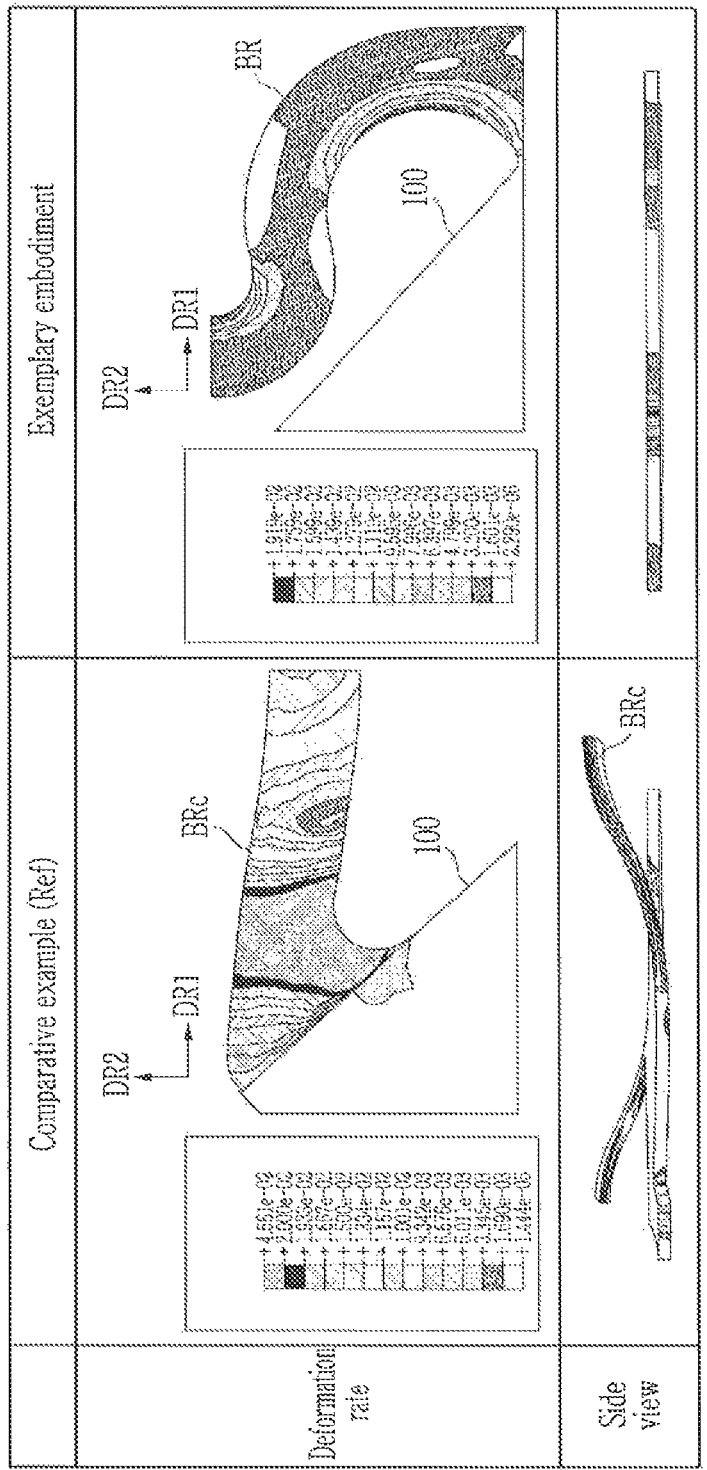
FIG. 16 is a view showing a deformation rate and a shape of a bridge when elongating a display device according to a comparative example and an exemplary embodiment of the present invention.

FIG. 16 shows the deformation rate of bridges BRc and BR in terms of grayscale, and the deformation shape, when pulling the display area of the display device according to a comparative example and an exemplary embodiment of the present invention in one direction, for example, when stretching in the first direction DR1 by 5%. The bridge BRc of the display device of the comparative example Ref has a straight line belt shape without a curved part, different from the bridge BR of the present exemplary embodiment. It can be seen that the deformation rate of the bridge BRc of the display device of the comparative example Ref is much larger than the deformation rate of the bridge BR of the display device according to the present exemplary embodiment. In addition, the bridge BR of the display device according to the present exemplary embodiment does not have a shape change when the display device is deformed. However, the bridge BRc of the display device of the comparative example Ref is bent during when the display device is deformed, and thus, the shape change is large. As a consequence, the bridge BRc may be severely damaged.

Figure 17:
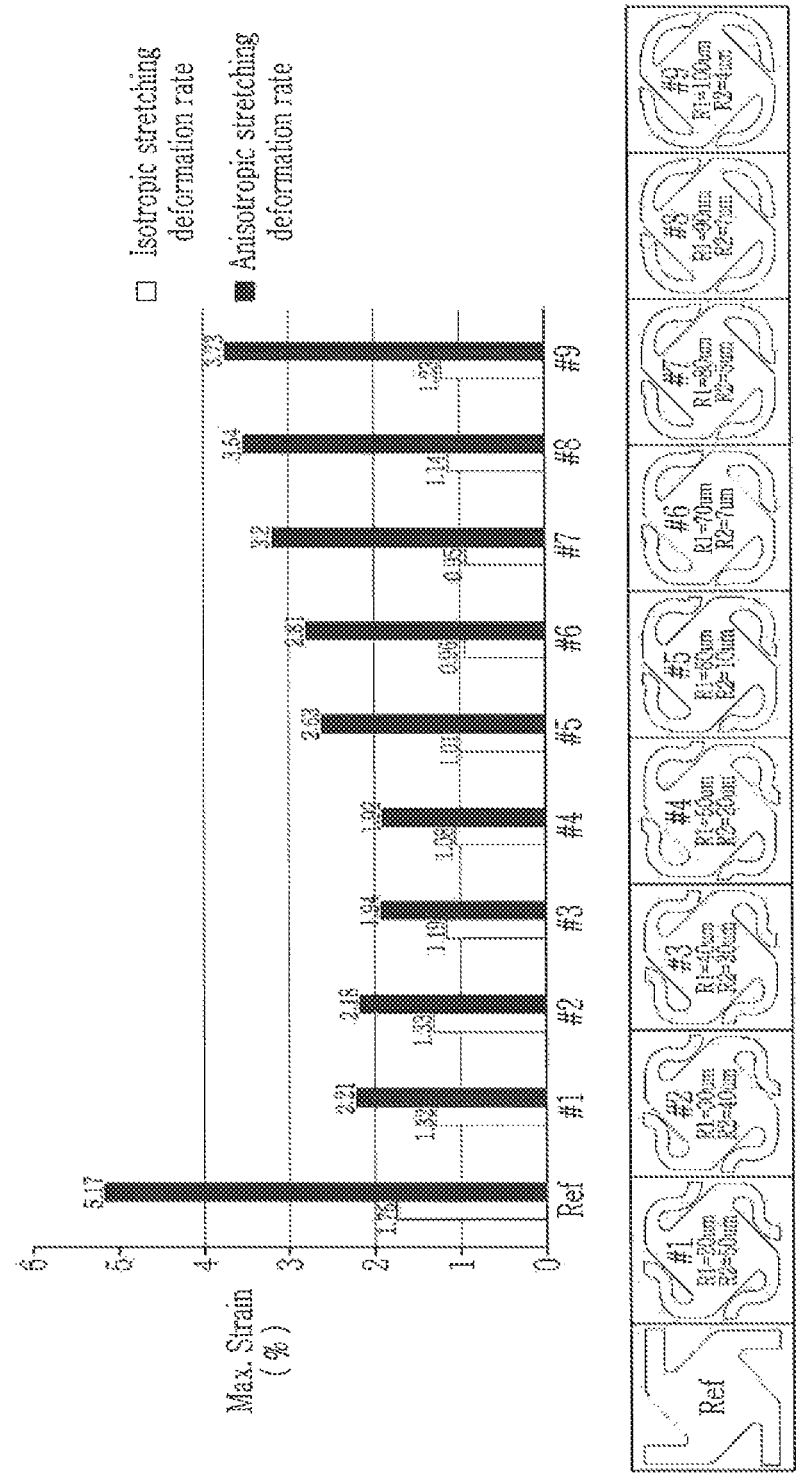
FIG. 17 is a bar graph comparing and showing a maximum deformation rate of a bridge of a display device when elongating a display device according to a comparative example and several exemplary embodiments of the present invention, isotropically and anisotropically.

FIG. 17 as a bar graph comparing the results of FIG. 14, FIG. 15, and FIG. 16 and shows the maximum deformation rate of the bridge BRc shown in FIG. 16 and the maximum deformation rate of the bridge BR according to an exemplary embodiment of the present invention when pulling the display area of the display device of the comparative example Ref and the present exemplary embodiment in two directions that are crossed (e.g., isotropic stretching) and only in one direction (e.g., anisotropic stretching).

Compared with the comparative example Ref of the straight line shape in which the bridge BRc does not have the curved part, it can be seen that the maximum deformation rate of the bridge BR of the display device according to the present exemplary embodiment in cases of the anisotropic stretching and the isotropic stretching is low. Therefore, the deformation ability such as the stretching ability and furthermore the contraction ability of the display area DA of the display device according to the present exemplary embodiment may be increased.

In addition, as above-described, the case of the exemplary embodiments #3 and #4 (refer to FIGS. 14 and 17) in which the curvature radius is larger than the curvature radius R2 and the difference between the two curvature radiuses R1 and R2 is smaller than 50 micrometers, the maximum deformation rate of the bridge BR is lowest such that the stretching ability of the display area DA may be increased.

As above-described, according to the exemplary embodiments of the present invention, the maximum deformation rate applied to the bridge BR is low because of the shape of the bridge BR such that the probability of the crack is low. Therefore, the stretching ability is increased on the entire display area DA, thereby providing a display device with good stretching ability.

Next, the arrangement of the pixels in the main portion 100 of the display device according to an exemplary embodiment of the present invention is described with reference to FIG. 18 to FIG. 28 as well as the above-described drawings.

Figure 18:
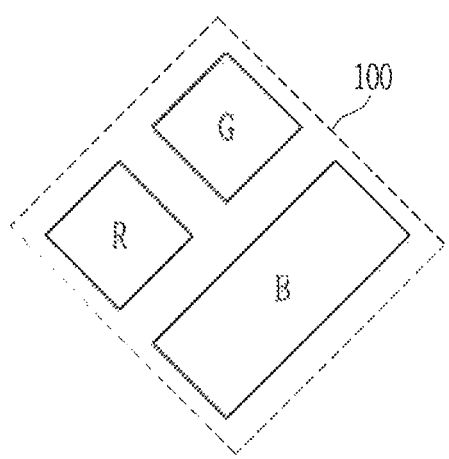
FIG. 18 is a layout view of pixels disposed in one main portion of a display device according to an exemplary embodiment of the present invention.
Figure 18:

Referring to FIG. 18, the red pixel R, the green pixel G, and the blue pixel B may be disposed one by one on one main portion 100. The light emission area of the blue pixel B may be larger than the light emission area of the red pixel R and the light emission area of the green pixel G, but the present invention is not limited thereto. The present exemplary embodiment may be the same as the above-described exemplary embodiment shown in FIG. 5.

Figure 19:
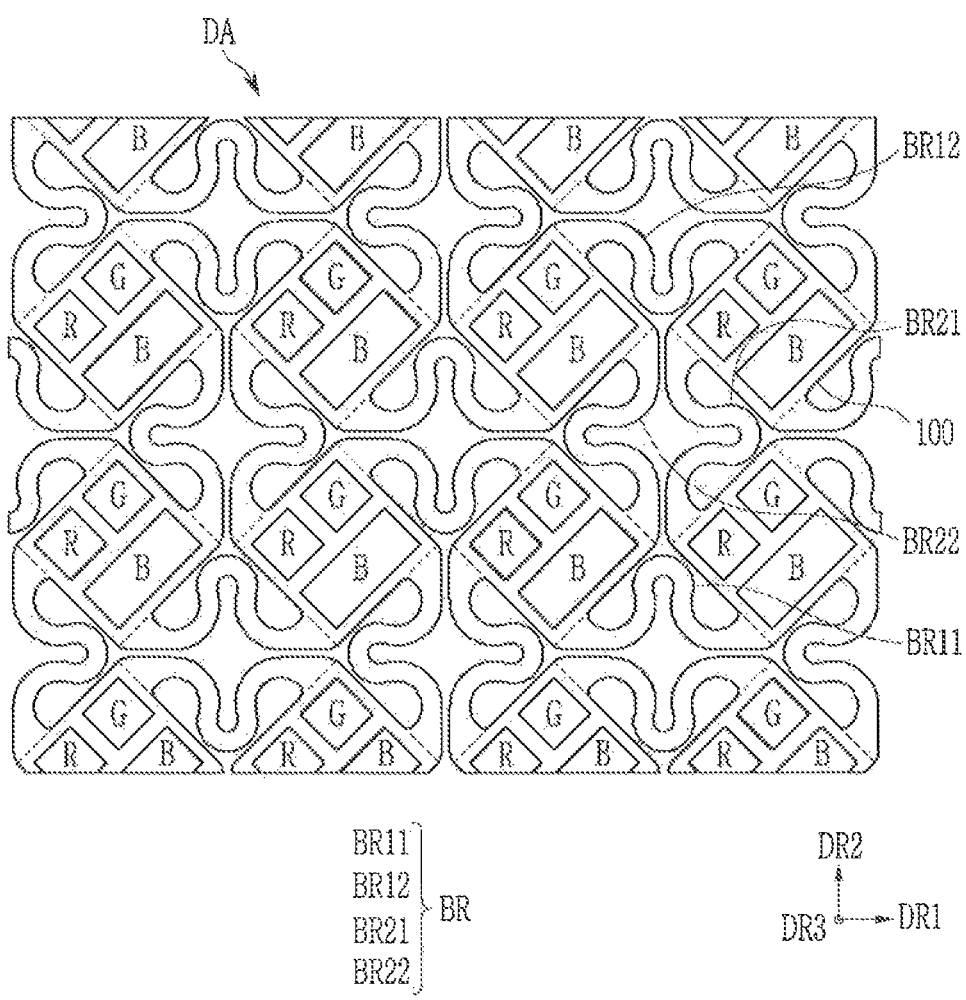
FIG. 19, FIG. 20 and FIG. 21 are top layout views showing an arrangement of pixels of a display device according to exemplary embodiment of the present invention, respectively.
Figure 20:
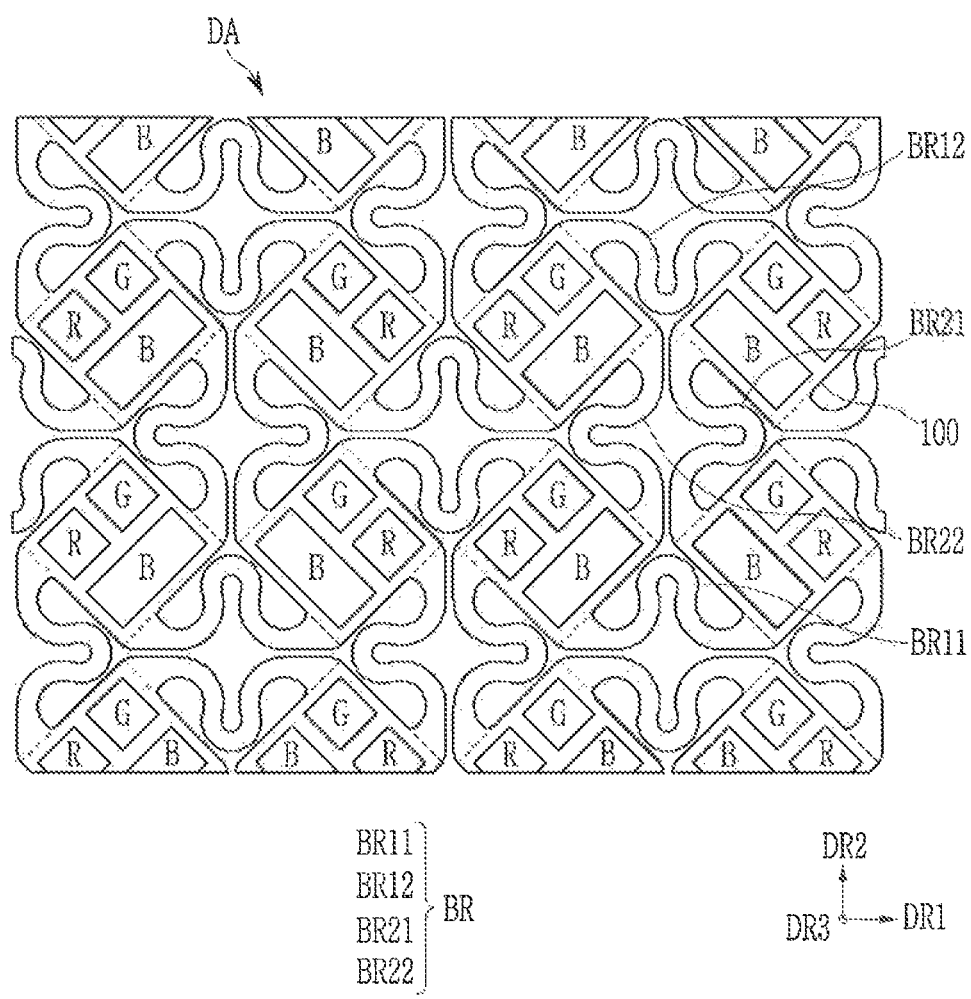
Figure 21:
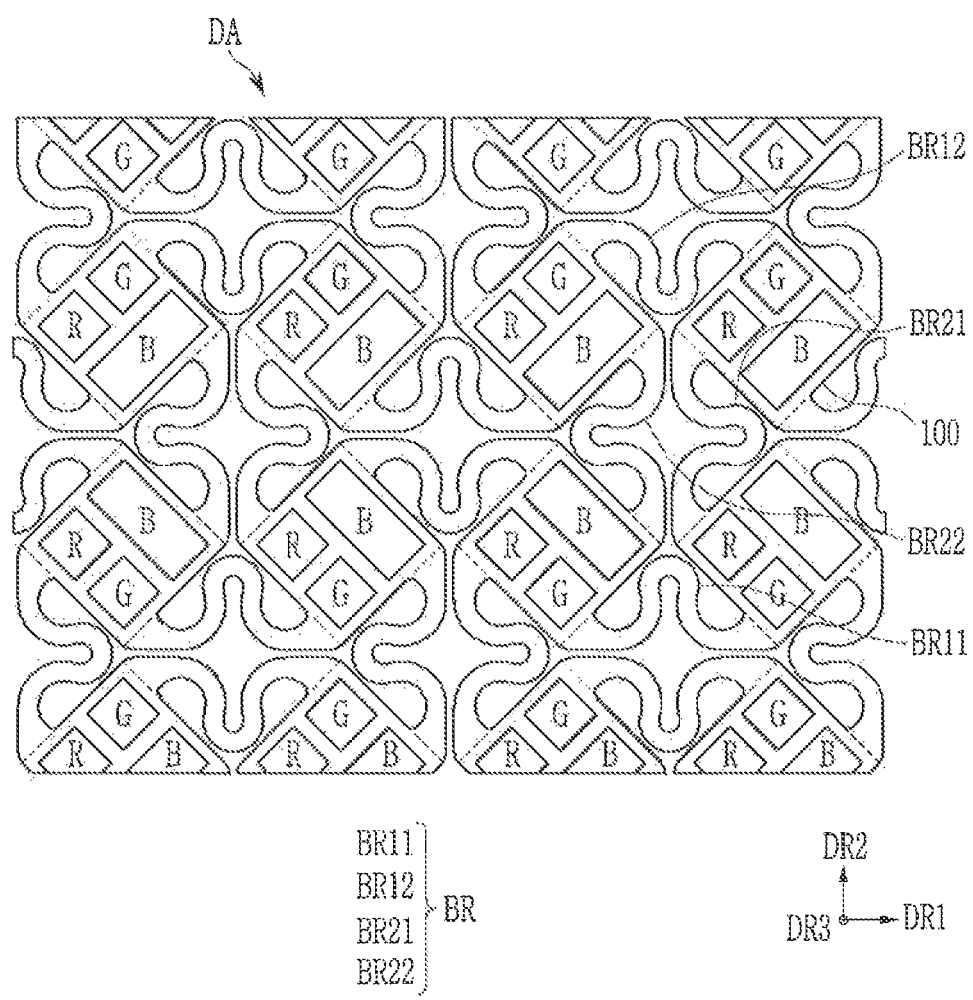

FIG. 19, FIG. 20 and FIG. 21 show various exemplary embodiments of the present invention to which the pixel arrangement shown in FIG. 18 is applied.

Referring to FIG. 19, the arrangement of the pixels R, G, and B disposed in each main portion 100 may be constant. In other words, the arrangement of the pixels R, G, and B disposed in each main portion 100 may be the same.

Referring to FIG. 20, different from FIG. 19, the arrangement of the pixels R, G, and B disposed in two main portions 100 adjacent in the first direction DR1 may have mirror symmetry (or line symmetry with reference to a center line of the second direction DR2 between the two adjacent main portions 100) with each other.

Referring to FIG. 21, different from FIG. 19, the arrangement of the pixels R, G, and B disposed in two main portions 100 adjacent in the second direction DR2 may have mirror symmetry (or line symmetry with reference to a center line of the first direction DR1 between the two adjacent main portions 100) with each other.

Figure 22:
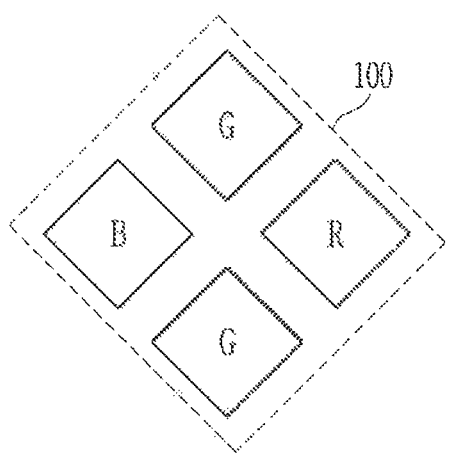
FIG. 22 is a layout view of pixels disposed in one main portion of a display device according to an exemplary embodiment of the present invention.
Figure 22:

Referring to FIG. 22, one red pixel R, one blue pixel B, and two green pixels G may be disposed on one main portion 100. The green pixels G of one column may be arranged in the second direction DR2, and the red pixel R and the blue pixel B may be alternately arranged in the first direction DR1.

Figure 23:
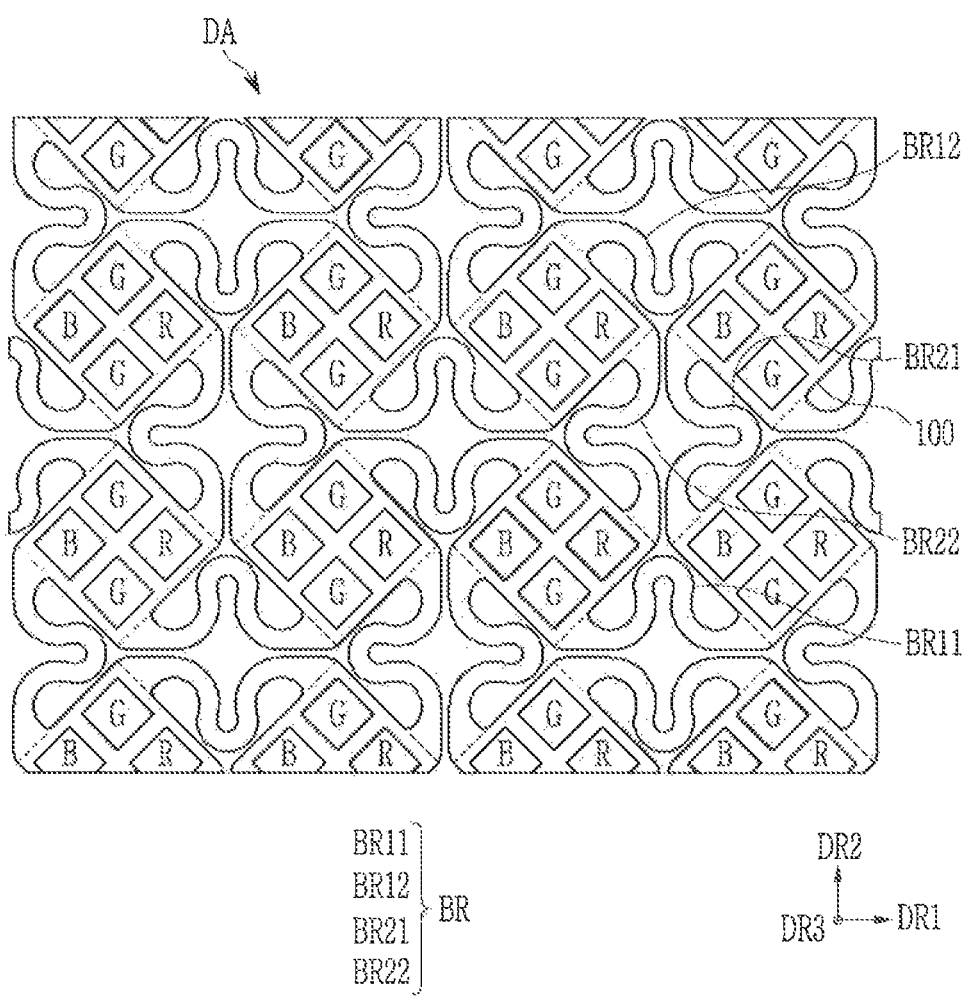
FIG. 23, FIG. 24 and FIG. 25 are layout views showing an arrangement of pixels of a display device according to an exemplary embodiment of the present invention, respectively.
Figure 24:
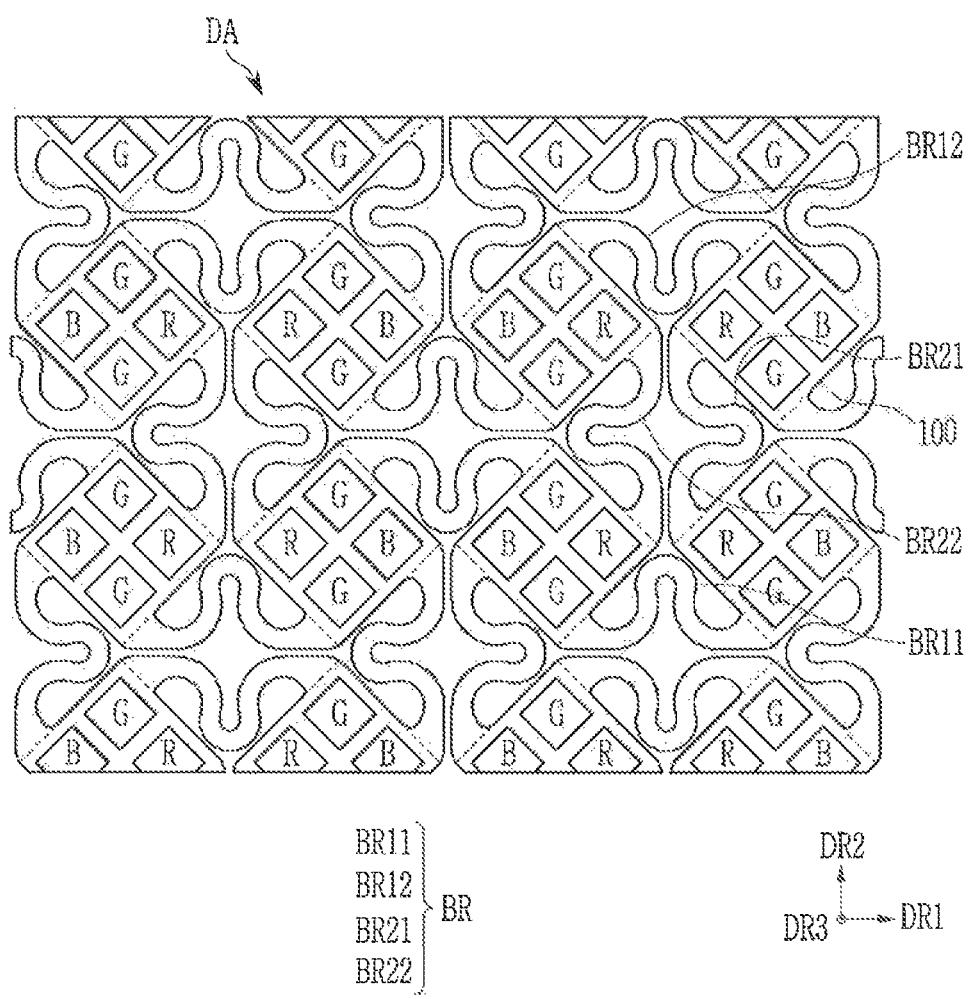
Figure 25:
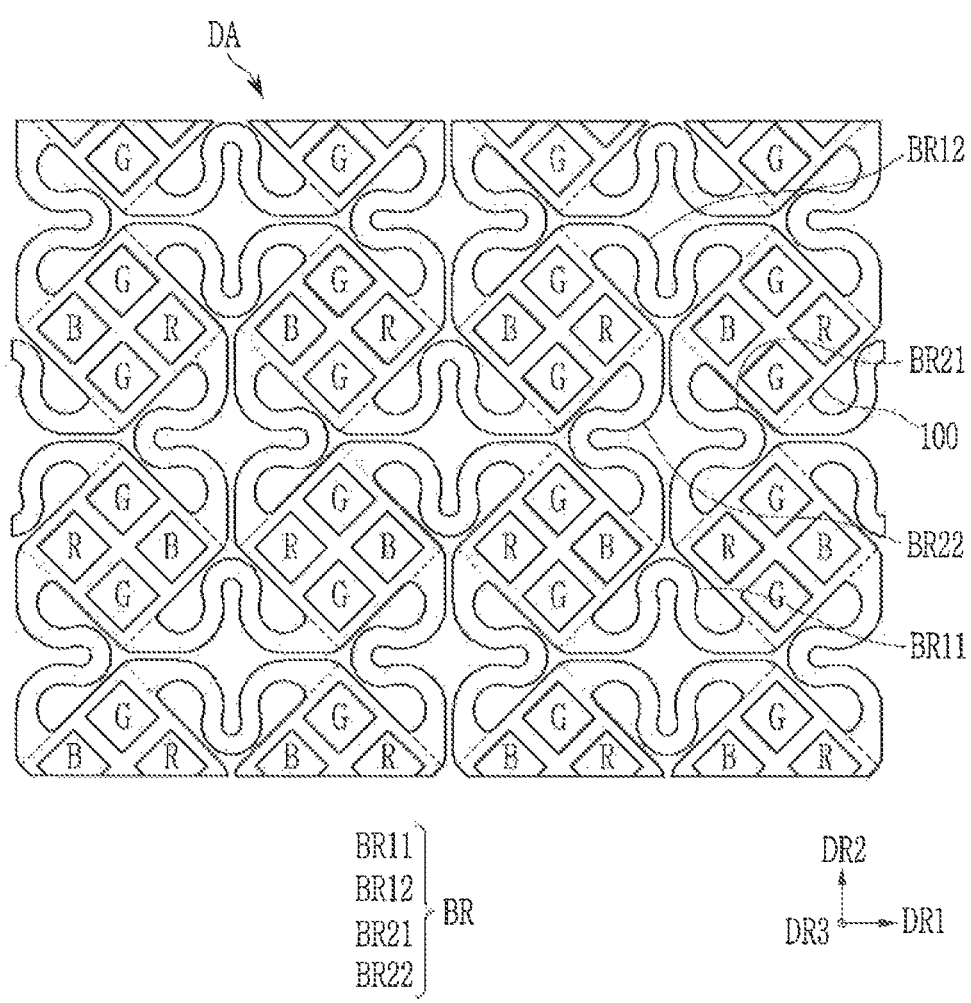

FIG. 23, FIG. 24 and FIG. 25 show various exemplary embodiments of the present invention to which the pixel arrangement shown in FIG. 22 is applied.

Referring to FIG. 23, the arrangement of the pixels R, G, and B disposed in each main portion 100 may be constant. In other words, the arrangement of the pixels R, G, and B disposed in each main portion 100 may be the same.

Referring to FIG. 24, different from FIG. 23, the arrangement of the pixels R, G, and B disposed in two main portions 100 adjacent in the first direction DR1 may have mirror symmetry (or line symmetry with reference to a center line of the second direction DR2 between the two adjacent main portions 100) with each other.

Referring to FIG. 25, different from FIG. 23, the arrangement of the pixels R, G, and B disposed in two main portions 100 adjacent in the second direction DR2 may have point symmetry. In other words, the right/left position of the blue pixel B and the red pixel R among the pixels R, G, and B disposed in the two main portions 100 adjacent in the second direction DR2 may be different from each other.

Figure 26:
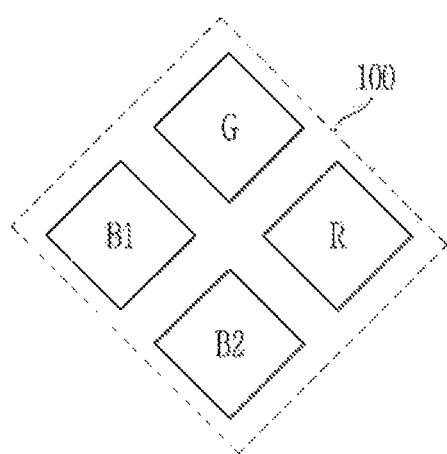
FIG. 26, FIG. 27 and FIG. 28 are layout views of pixels disposed in one main portion of a display device according to an exemplary embodiment of the present invention, respectively.
Figure 26:

Referring to FIG. 26, one red pixel R, one green pixel G, and a first blue pixel B1 and a second blue pixel 132 may be disposed in one main portion 100. The first blue pixel 131 and the second blue pixel B2 may emit blue light having different wavelengths.

Figure 27:
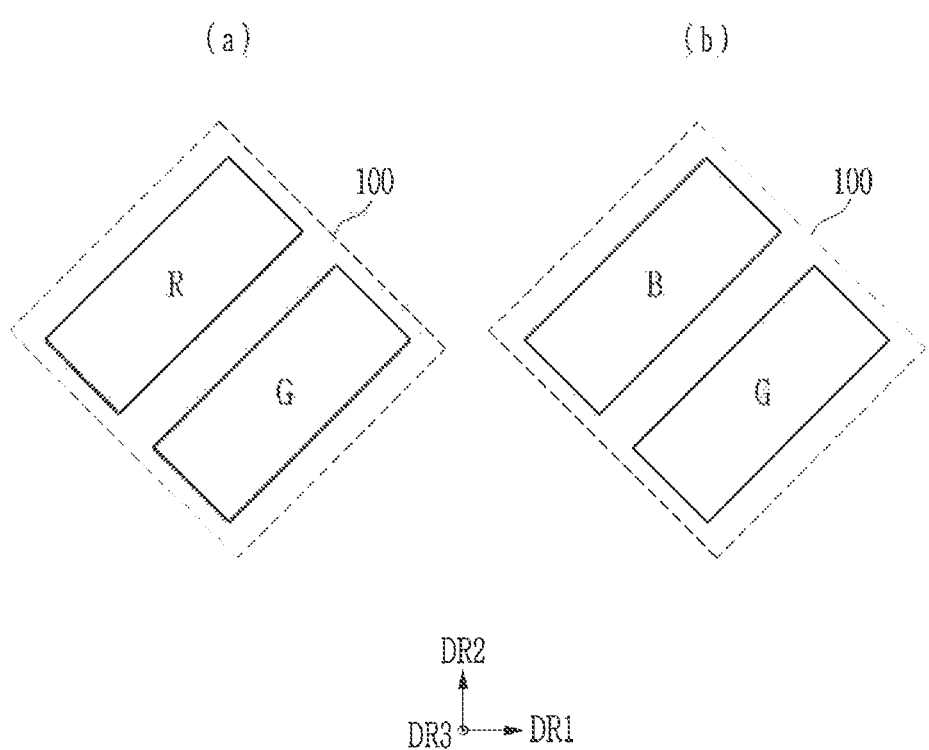

Referring to FIG. 27, in FIG. 27(a), two pixels of one red pixel R and one green pixel C may be disposed in one main portion 100, and in FIG. 27(b), two pixels of one blue pixel B and one green pixel C may be disposed in one main portion 100. The main portion 100 shown in FIG. 27(a) and the main portion 100 shown in FIG. 27(b) may be alternately arranged in the diagonal direction that is not parallel to the first direction DR1 and the second direction DR2.

Figure 28:
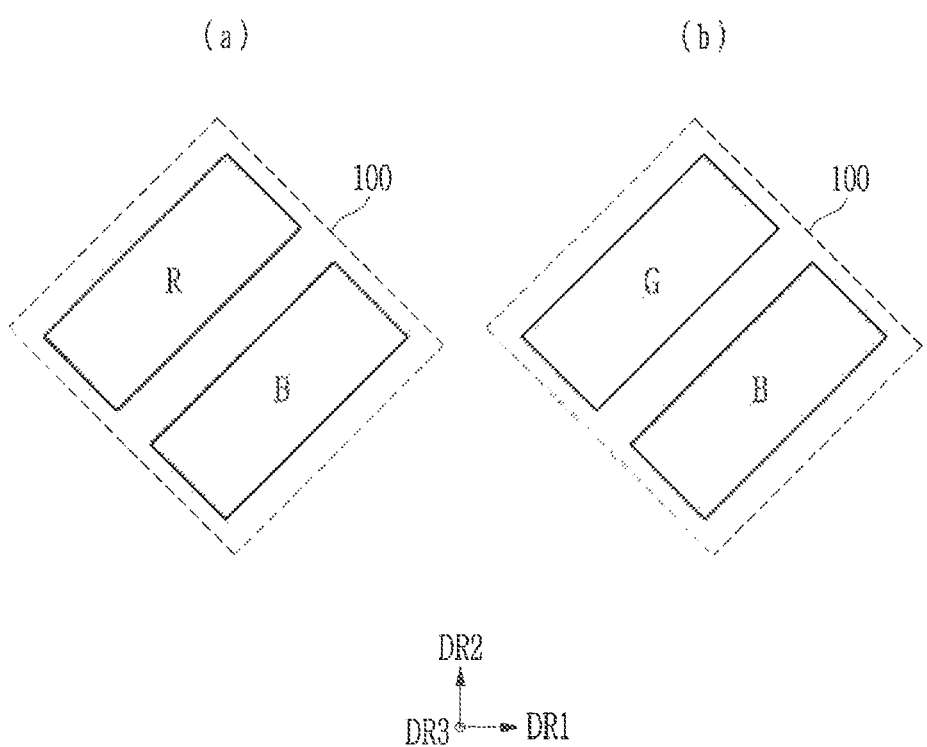

Referring to FIG. 28, in FIG. 28(a), two pixels of one red pixel R and one blue pixel B may be disposed in one main portion 100, and in FIG. 28(b), two pixels of one green pixel G and one blue pixel B may be disposed in one main portion 100. The main portion 100 shown in FIG. 28(a) and the main portion 100 shown in FIG. 28(b) may be alternately arranged in the diagonal direction that is not parallel to the first direction DR1 and the second direction DR2.

The pixel arrangement shown in FIG. 26 to FIG. 28 may be applied to the plurality of main portions 100 with the above-described arrangement shapes in FIG. 19, FIG. 20, FIG. 21, FIG. 23, FIG. 24, and FIG. 25.

According to another exemplary embodiment of the present invention, the pixels PX disposed on the main portion 100 may emit light of colors other than red, green, and blue, and the number of pixels PX positioned in the one main portion 100 may be variously changed.

While this invention has been particularly shown and described with reference to exemplary embodiments thereof, it will be understood by those of ordinary skill in the art that various modifications may be made thereto without departing from the spirit and scope of the present invention as defined by the appended claims.

What is claimed is:

1. A display device, comprising:
    a plurality of main portions separated from each other; and
    a plurality of bridges connecting adjacent main portions to each other,
    wherein a first ttram portion of the plurality of main portions comprises a transistor and a light emitting element,
    a first bridge of the plurality of bridges comprises a wiring that is, electrically connected to the transistor or the light emitting element, and
    the first bridge comprises curved parts that are curved in at least two different directions from each other, wherein:
    the first bridge comprises a substrate, a first insulating layer disposed on the substrate, and a second insulating layer disposed on the first insulating layer;
    the wiring is disposed between the first insulating layer and the second insulating layer; and
    the first insulating layer and the second insulating layer comprise an organic insulating material, wherein
    the first insulating layer does not overlap the transistor of the first main portion.

2. The display device of claim 1, wherein
    the wiring includes at least one of a data line, a driving voltage line for transmitting a first voltage, a voltage transmitting line for transmitting a second voltage different from the first voltage, and a gate line.

3. The display device of claim 1, wherein:
    the first main portion comprises at least one insulating layer disposed on the substrate;
    the at least one insulating layer does not exist in the first bridge; and
    the first insulating layer of the first bridge is in contact with a side surface of the at least one insulating layer near a boundary between the first bridge and the first main portion.

4. The display device of claim 1, wherein the first main portion comprises:
    the substrate;
    an active pattern disposed on the substrate;
    a third insulating layer disposed on the active pattern;
    a first conductive layer disposed on the third insulating layer;
    a fourth insulating layer disposed on the first conductive layer;
    a second conductive layer disposed on the fourth insulating layer;
    the second insulating layer disposed on the second conductive layer;
    a first electrode disposed on the second insulating layer;
    an emission layer disposed on the first electrode; and
    a second electrode disposed on the emission layer, and
    the wiring comprises a first portion in contact with the first insulating layer in the first bridge, and a second portion in contact with the fourth insulating layer in the first main portion.

5. The display device of claim 4, wherein
    the second insulating layer comprises a groove enclosing the transistor and the light emitting element near an edge of the first main portion.

6. The display device of claim 1, wherein:
    the first bridge comprises a first portion connected to the first main portion and a second portion connected to the first portion;
    the first portion is curved in a clockwise direction or a counterclockwise direction; and
    the second portion is curved in a different direction from that of the first portion.

7. The display device of claim 1, wherein:
    a second main portion of the plurality of main portions is adjacent to the first main portion,
    the first bridge connects the first main portion and the second main portion to each other and comprises a first portion directly connected to the first main portion, and a second portion directly connected to the second main portion,
    the first bridge further comprises a third portion connecting the first portion and the second portion to each other, wherein the third portion is curved in a clockwise direction or a counterclockwise direction, and
    the first portion and the second portion are curved in a different direction from that of the third portion..

8. The display device of claim 7, wherein:
    the plurality of bridges comprises the first bridge, a second bridge, a third bridge and a fourth bridge, wherein each of the first, second, third and fourth bridges is connected to the first main portion; and
    adjacent bridges among the first, second, third and fourth bridges have symmetrical shapes rotated by 90 degrees.

9. The display device of claim 1, wherein
    the first main portion has a shape of a polygon, a circle, or an oval.

10. A display device, comprising:
    a plurality of main portions separated from each other; and
    a plurality of bridges connecting adjacent main portions to each other, wherein a first main portion of the plurality of main portions comprises a transistor and a light emitting element, a first bridge of the plurality of bridges comprises a wiring that is electrically connected to the transistor or the light emitting element, and the first bridge comprises curved parts that are curved in at least two different, directions from each other, wherein:

the first bridge comprises a first curved part and a pair of second curved parts connected to respective ends of the first curved part;

a curve direction of the first curved part and a curve direction of the pair of second curved parts are different from each other;

a curvature radius of an inner edge of the second curved part is larger than a curvature radius of an inner edge of the first curved part: and the curvature radius of the inner edge of the second curved part is less than 90% μm, and a difference between the curvature radius of the inner edge of the second curved part and the curvature radius of the inner edge of die first curved part is less than 50 μm.

11. The display device of claim 10, wherein a curvature radius of each inner edge of the pair of second curved parts are the same.

12. A display device, comprising:
a main portion comprising a transistor and a light emitting element; and
a plurality of connection parts connected to the main portion,
at least one of the plurality of connection parts comprises:
a first portion connected to the main portion and having an inner edge curved in a first curvature radius; and
a second portion connected to the first portion, having an inner edge curved in a second curvature radius that is different from the first curvature radius, and curved in a different direction from that of the first portion, wherein:
the main portion and the plurality of connection parts comprise a substrate;
the main portion comprises at least one insulating layer disposed between the substrate and the light emitting element; and
the plurality of connection parts do not comprise the at least one insulating layer.

13. The display device of claim 12, wherein the first curvature radius is larger than the second curvature radius.

14. The display device of claim 12, wherein:
the plurality of connection parts comprises wiring electrically connected to the transistor or the light emitting element;

a first insulating layer comprising an organic insulating material is disposed between the wiring and the substrate; and
the main portion comprises an area without the first insulating layer.

15. The display device of claim 12, wherein:
the first portion is curved in a direction toward the main portion; and
the second portion is curved in a direction away from the main portion.

16. The display device of claim 12, wherein a curvature radius of a corner where the first portion is connected to the main portion is smaller than the first curvature radius.

17. A display device, comprising:
first and second main portions disposed adjacent to each other in a first row; and
third and fourth main portions disposed adjacent to each other in a second row,
wherein the first and third main portions are disposed in a first column, and the second and fourth main portions are disposed in a second column,
wherein the first and second main portions are connected to each other via a first flexible bridge, the second and fourth main portions are connected to each other via a second flexible bridge, the fourth and third main portions are connected to each other via a third flexible bridge, and the third and first main portions are connected to each other via a fourth flexible bridge,
wherein each of the first, second, third and fourth flexible bridges includes two curved connection parts, wherein:
the first flexible bridge comprises a substrate, a first insulating layer disposed on the substrate, and a second insulating layer disposed on the first insulating layer;
a wiring is disposed between the first insulating layer and the second insulating layer; and
the first insulating layer and the second insulating layer comprise an organic instalating material, wherein
the first insulating layer does not overlap a transistor of the first main portion.

18. The display device of claim 17, wherein the two curved connection parts of each of the first, second, third and fourth flexible bridges form a U-shape where they meet.

19. The display device of claim 17, wherein the first main portion has a square shape with a first curved connection part protruded from a first edge, a second curved connection part protruded from a second edge, a third curved connection part protruded from a third edge, and a fourth curved connection part protruded from a fourth edge.

* * * * *